(12) United States Patent
Sekine et al.

(10) Patent No.: US 11,183,507 B2
(45) Date of Patent: Nov. 23, 2021

(54) SEMICONDUCTOR MEMORY DEVICE AND METHOD FOR MANUFACTURING SAME

(71) Applicant: Toshiba Memory Corporation, Minato-ku (JP)

(72) Inventors: Katsuyuki Sekine, Yokkaichi (JP); Tatsuya Kato, Yokkaichi (JP); Fumitaka Arai, Yokkaichi (JP); Toshiyuki Iwamoto, Mie (JP); Yuta Watanabe, Yokkaichi (JP); Wataru Sakamoto, Yokkaichi (JP); Hiroshi Itokawa, Oita (JP); Akio Kaneko, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 95 days.

(21) Appl. No.: 15/682,996

(22) Filed: Aug. 22, 2017

(65) Prior Publication Data
US 2017/0373082 A1  Dec. 28, 2017

Related U.S. Application Data

(63) Continuation of application No. PCT/JP2015/055206, filed on Feb. 24, 2015.

(51) Int. Cl.
*H01L 27/11556* (2017.01)
*H01L 21/28* (2006.01)
(Continued)

(52) U.S. Cl.
CPC .. *H01L 27/11556* (2013.01); *H01L 21/02636* (2013.01); *H01L 21/76801* (2013.01);
(Continued)

(58) Field of Classification Search
CPC ......... H01L 21/02181; H01L 21/28273; H01L 21/28282; H01L 21/28088;
(Continued)

(56) References Cited

U.S. PATENT DOCUMENTS

| 6,005,270 | A | 12/1999 | Noguchi |
| 2006/0006454 | A1* | 1/2006 | Wang ................. H01L 29/7883 257/314 |

(Continued)

FOREIGN PATENT DOCUMENTS

| JP | 2006-13534 | 1/2006 |
| JP | 2012-69606 | 4/2012 |

(Continued)

OTHER PUBLICATIONS

International Search Report dated Mar. 24, 2015 in PCT/JP2015/055206, filed on Feb. 24, 2015 (with English translation).

(Continued)

*Primary Examiner* — Matthew C Landau
*Assistant Examiner* — Eric K Ashbahian
(74) *Attorney, Agent, or Firm* — Oblon, McClelland, Maier & Neustadt, L.L.P.

(57) ABSTRACT

A semiconductor memory device according to an embodiment, includes a semiconductor pillar extending in a first direction, a first electrode extending in a second direction crossing the first direction, a second electrode provided between the semiconductor pillar and the first electrode, a first insulating film provided between the semiconductor pillar and the second electrode, a second insulating film provided between the first electrode and the second electrode and on two first-direction sides of the first electrode, and a conductive film provided between the second electrode and the second insulating film, the conductive film not contacting the first insulating film.

16 Claims, 34 Drawing Sheets

(51) Int. Cl.
  *H01L 29/78* (2006.01)
  *H01L 29/66* (2006.01)
  *H01L 21/02* (2006.01)
  *H01L 21/768* (2006.01)
  *H01L 29/423* (2006.01)
  *H01L 29/45* (2006.01)
  *H01L 29/51* (2006.01)
  *H01L 29/788* (2006.01)
  *H01L 21/285* (2006.01)
  *H01L 21/3065* (2006.01)
  *H01L 21/311* (2006.01)
  *H01L 27/11519* (2017.01)
  *H01L 29/10* (2006.01)
  *H01L 29/49* (2006.01)

(52) U.S. Cl.
  CPC .. *H01L 29/40114* (2019.08); *H01L 29/42324* (2013.01); *H01L 29/456* (2013.01); *H01L 29/513* (2013.01); *H01L 29/515* (2013.01); *H01L 29/66666* (2013.01); *H01L 29/7827* (2013.01); *H01L 29/7883* (2013.01); *H01L 21/0217* (2013.01); *H01L 21/0262* (2013.01); *H01L 21/02164* (2013.01); *H01L 21/02181* (2013.01); *H01L 21/02271* (2013.01); *H01L 21/02532* (2013.01); *H01L 21/02592* (2013.01); *H01L 21/28562* (2013.01); *H01L 21/28568* (2013.01); *H01L 21/3065* (2013.01); *H01L 21/31111* (2013.01); *H01L 21/31116* (2013.01); *H01L 27/11519* (2013.01); *H01L 29/1037* (2013.01); *H01L 29/4958* (2013.01); *H01L 29/4966* (2013.01); *H01L 29/4975* (2013.01); *H01L 29/517* (2013.01); *H01L 29/7889* (2013.01)

(58) Field of Classification Search
  CPC ......... H01L 21/76843; H01L 29/42332; H01L 29/4925; H01L 29/66825; H01L 29/7926; H01L 29/66833; H01L 29/7889; H01L 29/42324; H01L 29/4234; H01L 29/4916; H01L 29/495; H01L 29/66666; H01L 29/7883; H01L 27/11556; H01L 27/11582; H01L 27/11578; H01L 27/11519; H01L 27/11551; H01L 27/1157; H01L 27/10891; H01L 27/11517; H01L 27/11565; H01L 29/40117; H01L 29/792; H01L 27/11521–11582; G11C 16/0408; G11C 16/0483
  See application file for complete search history.

(56) References Cited

U.S. PATENT DOCUMENTS

| | | | |
|---|---|---|---|
| 2009/0302365 A1* | 12/2009 | Bhattacharyya | H01L 29/40114 257/298 |
| 2010/0270593 A1 | 10/2010 | Lung et al. | |
| 2011/0217828 A1* | 9/2011 | Son | H01L 21/20 438/486 |
| 2011/0294290 A1* | 12/2011 | Nakanishi | H01L 27/11551 438/666 |
| 2011/0316066 A1* | 12/2011 | Tanaka | H01L 21/28273 257/315 |
| 2012/0001247 A1 | 1/2012 | Alsmeier | |
| 2012/0069660 A1 | 3/2012 | Iwai et al. | |
| 2012/0132981 A1* | 5/2012 | Imamura | H01L 29/7889 257/321 |
| 2012/0181596 A1 | 7/2012 | Liu | |
| 2012/0217564 A1* | 8/2012 | Tang | H01L 29/4966 257/315 |
| 2013/0032873 A1 | 2/2013 | Kiyotoshi | |
| 2013/0221423 A1 | 8/2013 | Kawasaki et al. | |
| 2013/0273727 A1 | 10/2013 | Lee et al. | |
| 2014/0175530 A1 | 6/2014 | Chien et al. | |
| 2014/0291848 A1 | 10/2014 | Lee et al. | |
| 2014/0339622 A1* | 11/2014 | Murata | H01L 27/11524 257/316 |
| 2014/0339624 A1* | 11/2014 | Ramaswamy | H01L 29/792 257/326 |
| 2014/0353738 A1* | 12/2014 | Makala | H01L 27/11578 257/321 |
| 2015/0064865 A1* | 3/2015 | Sim | H01L 27/11526 438/268 |
| 2015/0364483 A1* | 12/2015 | Koval | H01L 21/32133 438/257 |
| 2015/0364485 A1 | 12/2015 | Shimura et al. | |
| 2015/0380422 A1* | 12/2015 | Sharangpani | H01L 27/11556 365/185.17 |
| 2016/0043096 A1* | 2/2016 | Blomme | H01L 21/02592 438/261 |

FOREIGN PATENT DOCUMENTS

| | | |
|---|---|---|
| JP | 2013-38124 | 2/2013 |
| JP | 2013-534058 | 8/2013 |
| JP | 2013-182949 | 9/2013 |
| JP | 2013-222970 | 10/2013 |

OTHER PUBLICATIONS

Written Opinion dated Mar. 24, 2015 in PCT/JP2015/055206, filed on Feb. 24, 2015.

* cited by examiner

SEMICONDUCTOR MEMORY DEVICE AND METHOD FOR MANUFACTURING SAME

CROSS-REFERENCE TO RELATED APPLICATION

This is a continuation application of International Application PCT/JP2015/055206, filed on Feb. 24, 2015; the entire contents of which are incorporated herein by reference.

FIELD

Embodiments relate to a semiconductor memory device and a method for manufacturing the same.

BACKGROUND

Conventionally, in NAND flash memory, the bit cost has been reduced by increasing the integration by downscaling the planar structure; but the downscaling of the planar structure is approaching a limit. Therefore, in recent years, technology has been proposed to stack the memory cells in the vertical direction. However, the reliability is a challenge for such a stacked type memory device.

DETAILED DESCRIPTION

A semiconductor memory device according to an embodiment, includes a semiconductor pillar extending in a first direction, a first electrode extending in a second direction crossing the first direction, a second electrode provided between the semiconductor pillar and the first electrode, a first insulating film provided between the semiconductor pillar and the second electrode, a second insulating film provided between the first electrode and the second electrode and on two first-direction sides of the first electrode, and a conductive film provided between the second electrode and the second insulating film, the conductive film not contacting the first insulating film.

A method for manufacturing a semiconductor memory device according to an embodiment, includes stacking an inter-layer insulating film and a first film alternately along a first direction. The method includes forming a trench extending in a second direction and piercing the inter-layer insulating film and the first film. The second direction crosses the first direction. The method includes forming a first recess in a side surface of the trench by removing a portion of the first film via the trench. The method includes forming a second electrode inside the first recess. The method includes forming a first insulating film on the side surface of the trench. The method includes forming a semiconductor film on a side surface of the first insulating film. The method includes forming a slit extending in the second direction and piercing the inter-layer insulating film and the first film. The method includes forming a second recess in a side surface of the slit by removing the first film via the slit. The method includes forming a conductive film on an inner surface of the second recess. The method includes forming a second insulating film on a side surface of the conductive film. The method includes forming a first electrode on a side surface of the second insulating film inside the second recess. The method includes dividing the semiconductor film, the first insulating film, and the second electrode along the second direction.

Embodiments of the invention will now be described with reference to the drawings.

First, a first embodiment will be described.

Figure 1A:
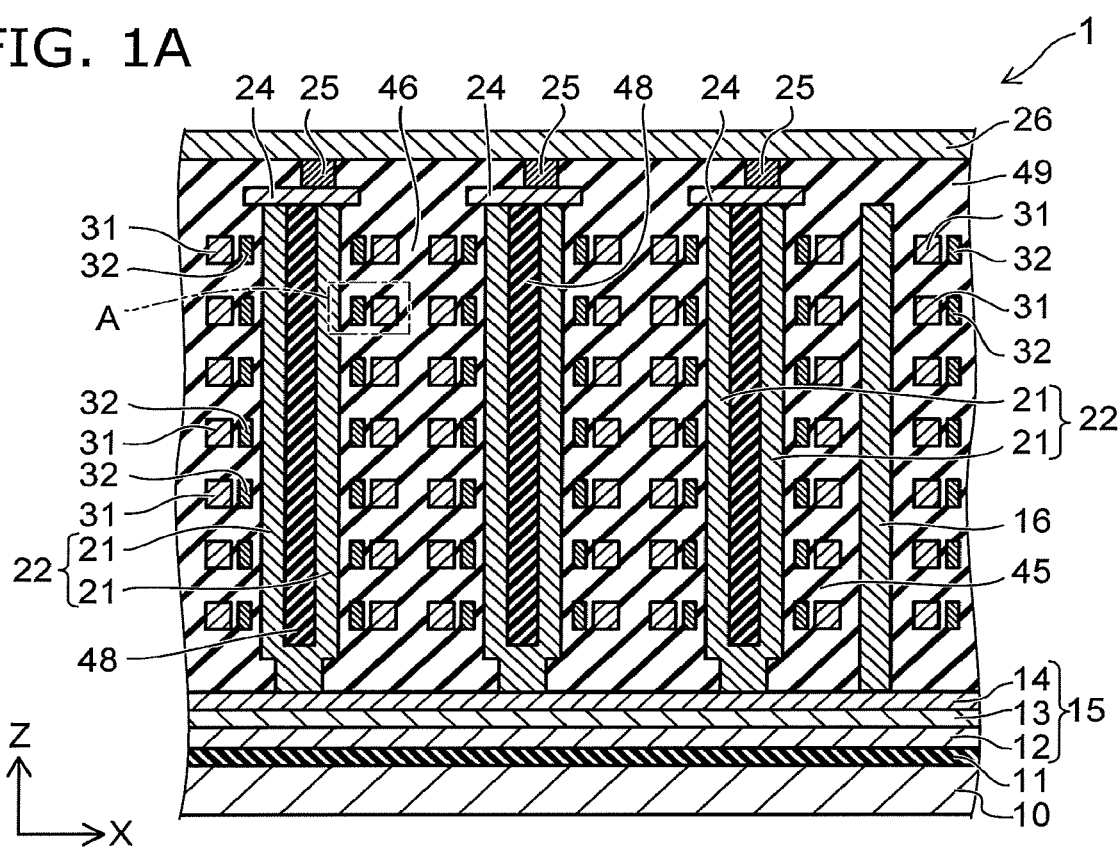
FIG. 1A is a cross-sectional view showing a semiconductor memory device according to a first embodiment.
Figure 1B:
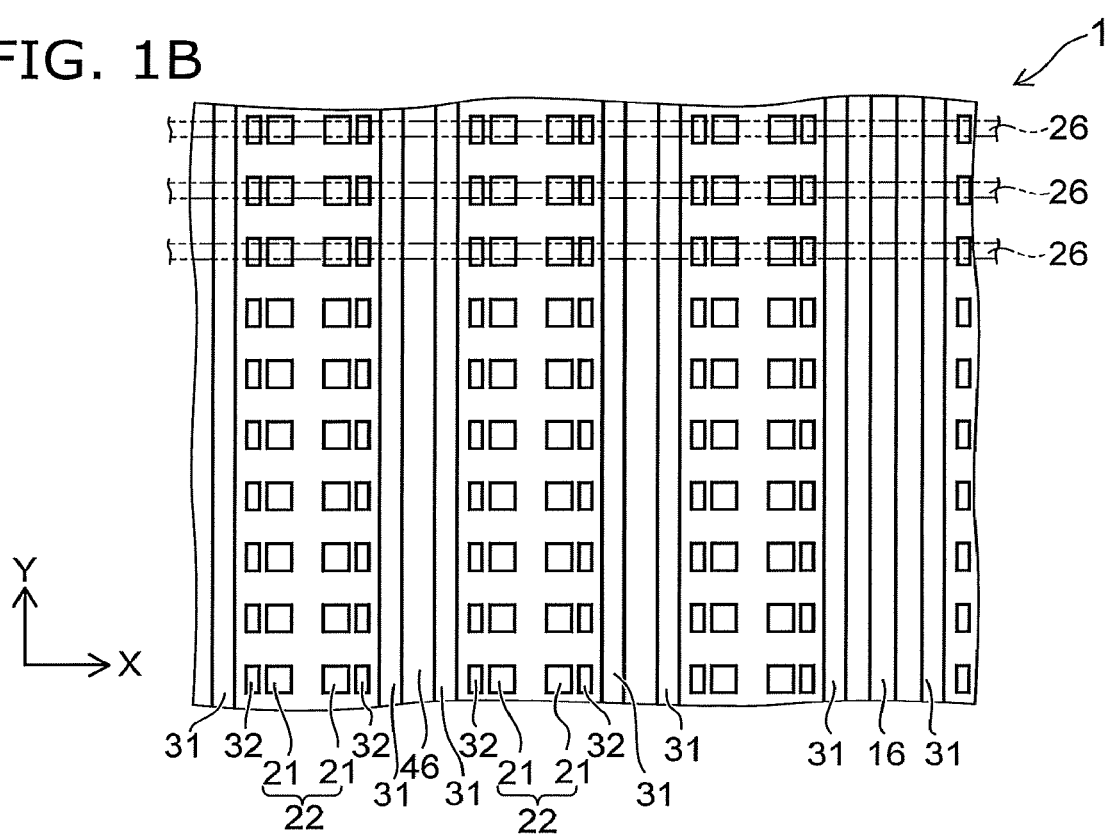
FIG. 1B is a plan view thereof.

FIG. 1A is a cross-sectional view showing a semiconductor memory device according to the embodiment; and FIG. 1B is a plan view of the semiconductor memory device according to the embodiment.

Figure 2:
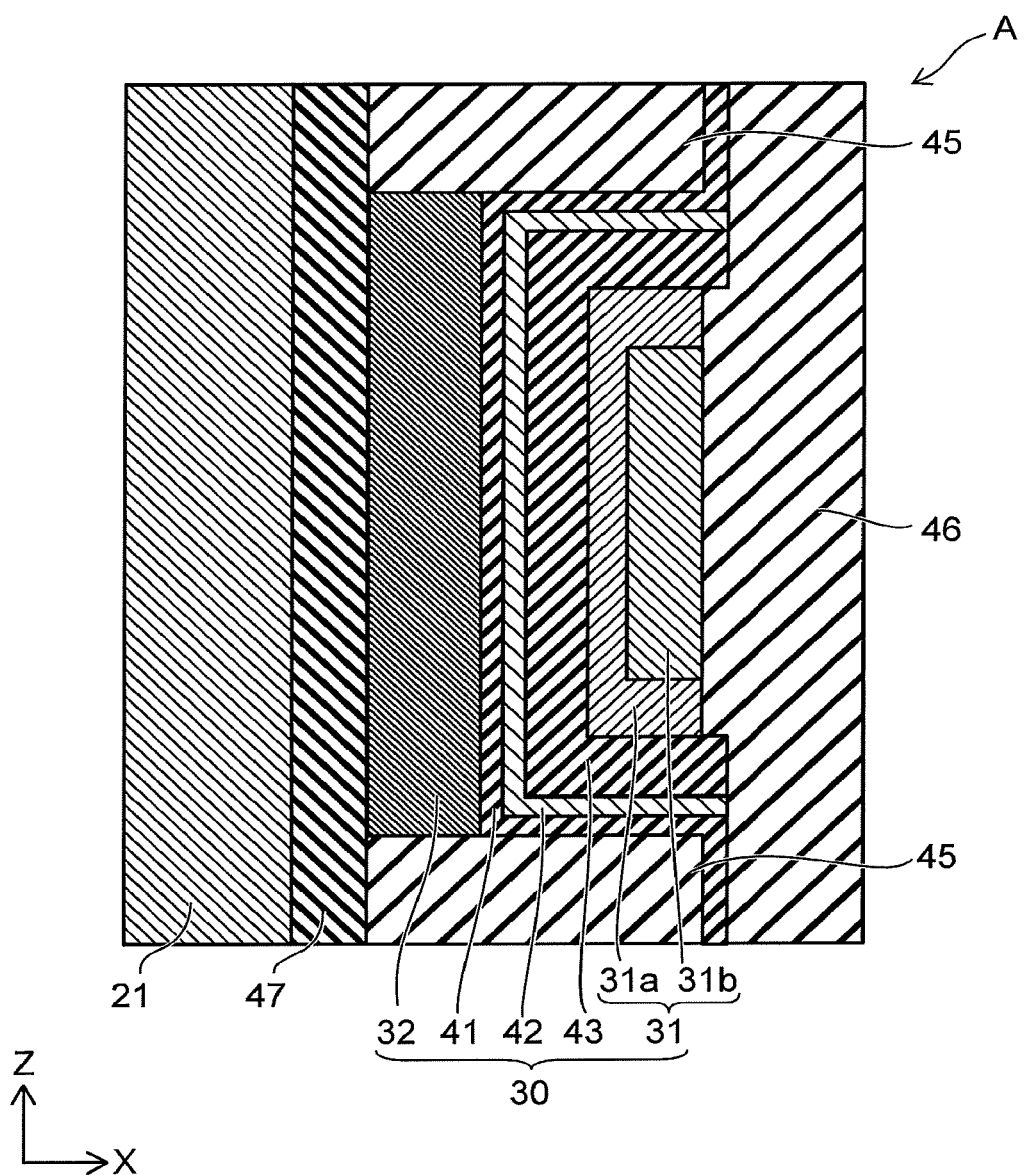
FIG. 2 is a partially enlarged cross-sectional view showing region A of FIG. 1A.

FIG. 2 is a partially enlarged cross-sectional view showing region A of FIG. 1A.

First, a schematic configuration of the semiconductor memory device 1 according to the embodiment will be described.

As shown in FIG. 1A and FIG. 1B, a silicon substrate 10 is provided in the semiconductor memory device 1. Hereinbelow, an XYZ orthogonal coordinate system is employed in the specification for convenience of description. Two mutually-orthogonal directions parallel to the upper surface of the silicon substrate 10 are taken as an "X-direction" and a "Y-direction;" and a direction perpendicular to the upper surface is taken as a "Z-direction."

An insulating film 11 made of, for example, silicon oxide, a conductive layer 12 made of, for example, polysilicon, an interconnect layer 13 made of, for example, tungsten, and a conductive layer 14 made of, for example, polysilicon are stacked in this order on the silicon substrate 10. A cell source line 15 is formed of the conductive layer 12, the interconnect layer 13, and the conductive layer 14. The cell source line 15 spreads along the XY plane.

Multiple silicon pillars 21 that extend in the Z-direction are provided on the cell source line 15. The silicon pillars 21 are arranged in a matrix configuration along the X-direction and the Y-direction. The lower end portions of two silicon pillars 21 adjacent to each other in the X-direction are connected to each other; and the lower end portions are connected to the cell source line 15. Hereinbelow, the two silicon pillars 21 of which the lower end portions are connected to each other are called a "pillar pair 22."

A connection member 24 that has the X-direction as the longitudinal direction is provided on the pillar pair 22 and is connected to the upper end portions of the two silicon pillars 21 included in the pillar pair 22. A plug 25 is provided on the connection member 24; and multiple bit lines 26 that extend in the X-direction are provided on the plugs 25. For example, the connection members 24, the plugs 25, and the bit lines 26 are formed of tungsten (W). Each of the bit lines 26 is connected via the plugs 25 and the connection members 24 to the multiple silicon pillars 21 arranged in one column along the X-direction. Therefore, each of the silicon pillars 21 is connected between the bit line 26 and the cell source line 15.

Because FIG. 1A and FIG. 1B are drawings showing the general concept of the device, only several conductive members are shown; and the insulating members are not illustrated. Further, a conductive film 42 described below also is not illustrated. Further, in FIG. 1B, the plugs 25 and the connection members 24 also are not illustrated. Further, in FIG. 1B, only some of the bit lines 26 are shown by double dot-dash lines; and the remaining bit lines 26 are not illustrated.

Multiple control gate electrodes 31 that extend in the Y-direction are provided on the cell source line 15. As described below, the control gate electrodes 31 are formed of a metal such as tungsten, etc. The control gate electrodes 31 are arranged in one column along the Z-direction on the two X-direction sides of the pillar pairs 22 arranged in one column along the Y-direction. Also, one unit includes the multiple pairs of pillar pairs 22 arranged in one column along the Y-direction and the multiple control gate electrodes 31 arranged in one column along the Z-direction on each of the two X-direction sides of the multiple pairs of pillar pairs 22. In other words, the two control gate electrodes 31 and the two silicon pillars 21 included in the pillar pair 22 are arranged alternately along the X-direction.

A floating gate electrode 32 is provided between each of the silicon pillars 21 and each of the control gate electrodes 31. The floating gate electrode 32 is insulated from the periphery, is a conductive member that stores charge, and is formed of, for example, polysilicon (Si). The floating gate electrode 32 is disposed at each crossing portion between the silicon pillars 21 and the control gate electrodes 31. In other words, the multiple floating gate electrodes 32 are arranged in a matrix configuration separated from each other along the Y-direction and the Z-direction between a column of the silicon pillars 21 arranged in one column along the Y-direction and a column of the control gate electrodes 31 arranged in one column along the Z-direction. Because the silicon pillars 21 and the control gate electrodes 31 are arranged also along the X-direction, the floating gate electrodes 32 are arranged in a three-dimensional matrix configuration along the X-direction, the Y-direction, and the Z-direction. Also, as described below, an insulating material is filled between the cell source line 15, the silicon pillars 21, the control gate electrodes 31, the floating gate electrodes 32, and the bit lines 26.

The configuration of the periphery of the crossing portion between each of the silicon pillars 21 and each of the control gate electrodes 31 of the semiconductor memory device 1 will now be described in detail.

As shown in FIG. 2, a barrier metal layer 31a that is made of, for example, titanium nitride (TiN) and a main portion 31b that is made of, for example, tungsten are provided in the control gate electrode 31. The barrier metal layer 31a covers the side surface of the main portion 31b on the floating gate electrode 32 side, the upper surface of the main portion 31b, and the lower surface of the main portion 31b.

Also, an inter-electrode insulating film 41 that is made of silicon oxide ($SiO_2$) or silicon nitride ($Si_3N_4$), the conductive film 42 that is made of, for example, ruthenium (Ru), and a blocking insulating film 43 that is made of, for example, ruthenium (Ru) are stacked in this order between the floating gate electrode 32 and the control gate electrode 31 from the floating gate electrode 32 toward the control gate electrode 31. The blocking insulating film 43 is a film in which a current substantially does not flow even when a voltage within the range of the drive voltage of the semiconductor memory device 1 is applied, is a high dielectric constant film in which, for example, the dielectric constant of the entirety is higher than the dielectric constant of silicon oxide, and is a three-layer film in which a hafnium oxide layer made of, for example, hafnium oxide ($HfO_2$), a silicon oxide layer made of silicon oxide, and a hafnium oxide layer made of hafnium oxide are stacked in this order.

The blocking insulating film 43 is disposed on the side surface of the barrier metal layer 31a of the control gate electrode 31 on the floating gate electrode 32 side, on the upper surface of the barrier metal layer 31a, and on the lower surface of the barrier metal layer 31a. The conductive film 42 is a continuous film and is disposed on the side surface of the blocking insulating film 43 on the floating gate electrode 32 side, on the upper surface of the blocking insulating film 43, and on the lower surface of the blocking insulating film 43. The inter-electrode insulating film 41 is disposed on the side surface of the conductive film 42 on the floating gate electrode 32 side, on the upper surface of the conductive film 42, and on the lower surface of the conductive film 42. Then, the floating gate electrode 32, the inter-electrode insulating film 41, and the conductive film 42 are divided every silicon pillar 21 in the Y-direction. On the other hand, the blocking insulating film 43 and the control gate electrode 31 extend to be continuous along the Y-direction.

Stacked bodies 30 that are made of the multiple floating gate electrodes 32, the multiple inter-electrode insulating films 41, and the multiple conductive films 42 arranged along the Y-direction and made of the blocking insulating film 43 and the control gate electrode 31 are arranged to be separated from each other along the Z-direction. Also, inter-layer insulating films 45 that are made of, for example, silicon oxide are provided between the stacked bodies 30 in the Z-direction. Also, an insulating member 46 that has a sheet configuration spreading along the YZ plane is provided between the structure bodies in which the stacked bodies 30 and the inter-layer insulating films 45 are arranged alternately along the Z-direction between the pillar pairs 22 adjacent to each other along the X-direction. The insulating member 46 is formed of, for example, silicon oxide.

Other than between the floating gate electrode 32 and the blocking insulating film 43, the inter-electrode insulating film 41 is disposed also between the inter-layer insulating film and the blocking insulating film 43 and between the inter-layer insulating film 45 and the insulating member 46.

Thereby, the inter-electrode insulating film 41 is at a position relatively proximal to the silicon pillar 21 between the floating gate electrode 32 and the control gate electrode 31 and at a position relatively distal to the silicon pillar 21 between the inter-layer insulating film 45 and the insulating member 46. Accordingly, as an entirety, the configuration of the inter-electrode insulating film 41 is a wave-like configuration extending in the Z-direction in which the position in the X-direction changes periodically. On the other hand, the configurations of the conductive film 42 and the blocking insulating film 43 are C-shaped configurations when viewed from the Y-direction and are divided between the control gate electrodes 31 adjacent to each other in the Z-direction.

A tunneling insulating film 47 is provided between the silicon pillar 21 and the floating gate electrode 32 and between the silicon pillar 21 and the inter-layer insulating film 45. The tunneling insulating film 47 is a film in which a tunneling current flows when a prescribed voltage within the range of the drive voltage of the semiconductor memory device 1 is applied and is, for example, a single-layer silicon oxide film, or a three-layer film made of a silicon oxide layer, a silicon nitride layer, and a silicon oxide layer. The average dielectric constant of the entire tunneling insulating film 47 is lower than the average dielectric constant of the entire blocking insulating film 43. Also, the tunneling insulating film 47 is provided every silicon pillar 21; and the configuration of the tunneling insulating film 47 is a band configuration extending in the Z-direction. The floating gate electrode 32 and the inter-electrode insulating film 41 are interposed between the tunneling insulating film 47 and the conductive film 42; and the conductive film 42 does not contact the tunneling insulating film 47.

Also, as shown in FIG. 1A and FIG. 1B, an insulating member 48 that is made of, for example, silicon oxide is provided between the two silicon pillars 21 belonging to the pillar pair 22. The insulating member 48 spreads along the YZ plane and is disposed also between the silicon pillars 21 adjacent to each other in the Y-direction, between the tunneling insulating films 47 adjacent to each other in the Y-direction, between the floating gate electrodes 32 adjacent to each other in the Y-direction, between the inter-electrode insulating films 41 adjacent to each other in the Y-direction, and between the conductive films 42 adjacent to each other in the Y-direction.

Further, a source electrode 16 that has a sheet configuration spreading along the YZ plane is provided between the control gate electrodes 31 that are between the pillar pairs 22 adjacent to each other in the X-direction. The lower end of the source electrode 16 is connected to the cell source line 15. Also, the source electrode 16 and the control gate electrodes 31 are insulated from each other by the insulating member 46.

In the semiconductor memory device 1, a transistor that includes one floating gate electrode 32 is formed at each crossing portion between the silicon pillars 21 and the control gate electrodes 31 and functions as a memory cell. Also, a NAND string in which multiple memory cells are connected in series is connected between the bit line 26 and the cell source line 15.

A method for manufacturing the semiconductor memory device according to the embodiment will now be described.

FIG. 3 to FIG. 17 are cross-sectional views showing the method for manufacturing the semiconductor memory device according to the embodiment.

Figure 3:
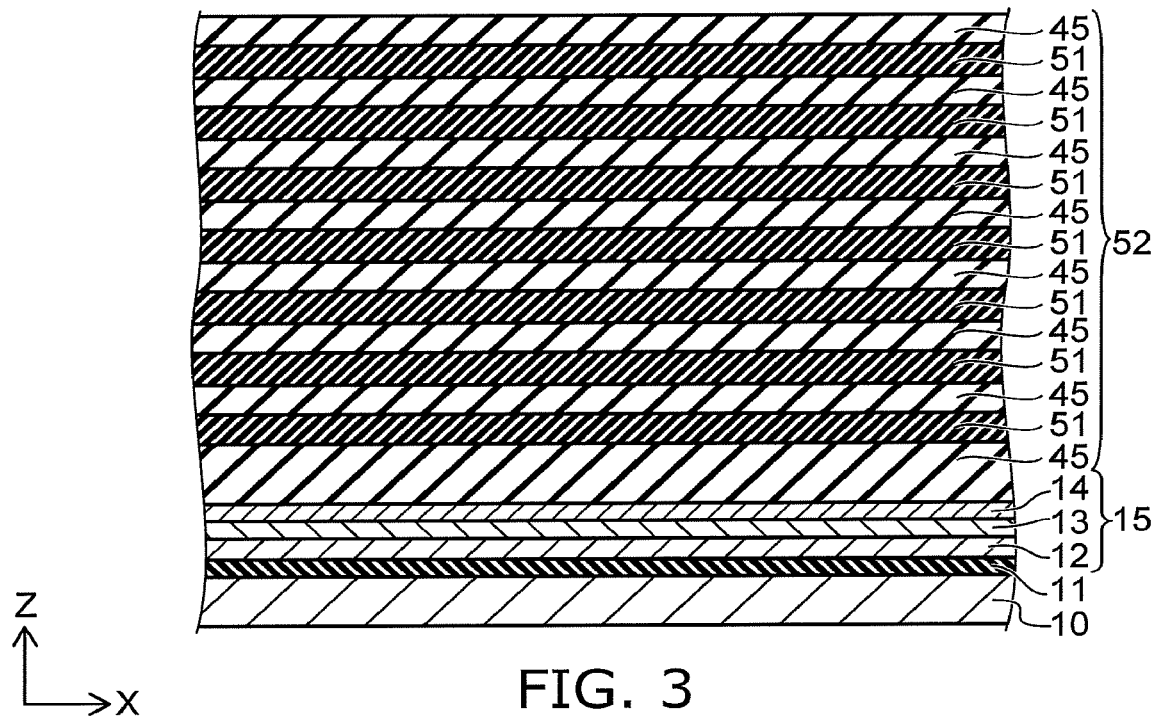
FIG. 3 to FIG. 17 are cross-sectional views showing a method for manufacturing the semiconductor memory device according to the first embodiment.

First, the silicon substrate 10 is prepared as shown in FIG. 3.

Then, the insulating film 11, the conductive layer 12, the interconnect layer 13, and the conductive layer 14 are formed in this order on the silicon substrate 10. The cell source line 15 is formed of the conductive layer 12, the interconnect layer 13, and the conductive layer 14.

Then, a stacked body 52 is formed by alternately stacking the inter-layer insulating films 45 made of, for example, silicon oxide and sacrificial films 51 made of, for example, silicon nitride on the cell source line 15.

Figure 4:
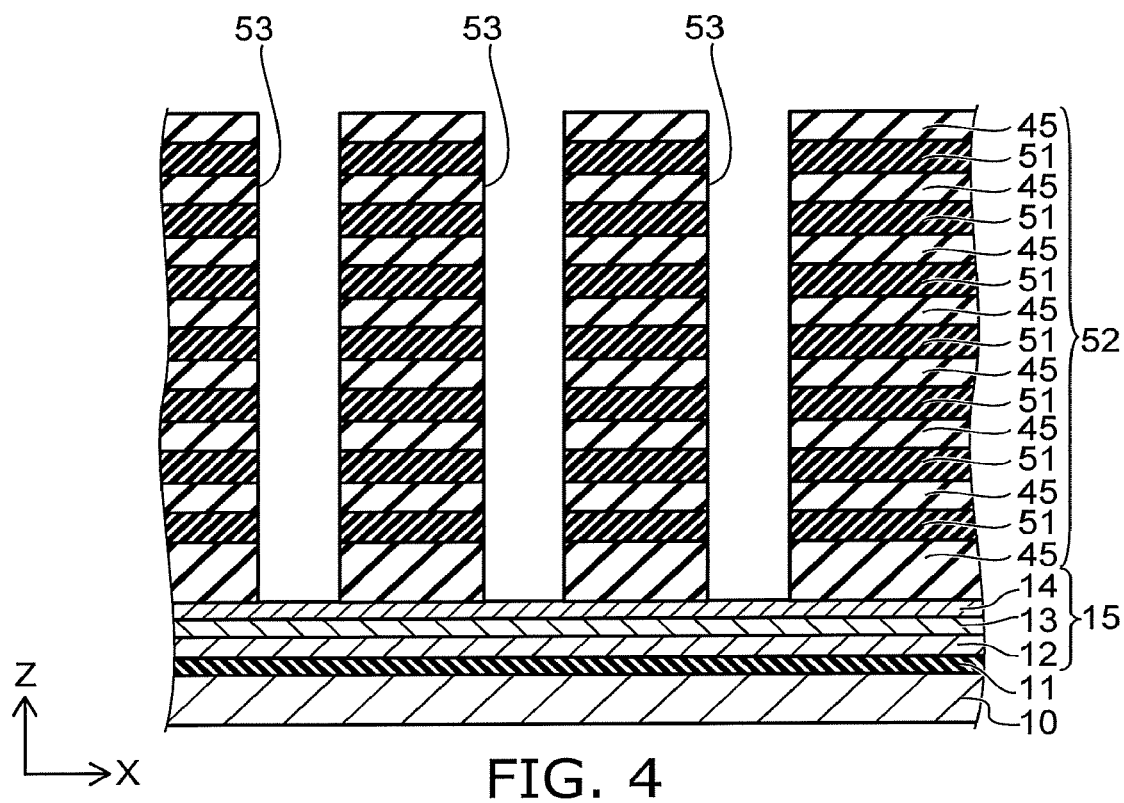

Then, as shown in FIG. 4, memory trenches 53 that extend in the Y-direction are multiply formed in the stacked body 52. The memory trenches 53 pierce the stacked body 52; and the cell source line 15 is exposed at the bottom surfaces of the memory trenches 53.

Figure 5:
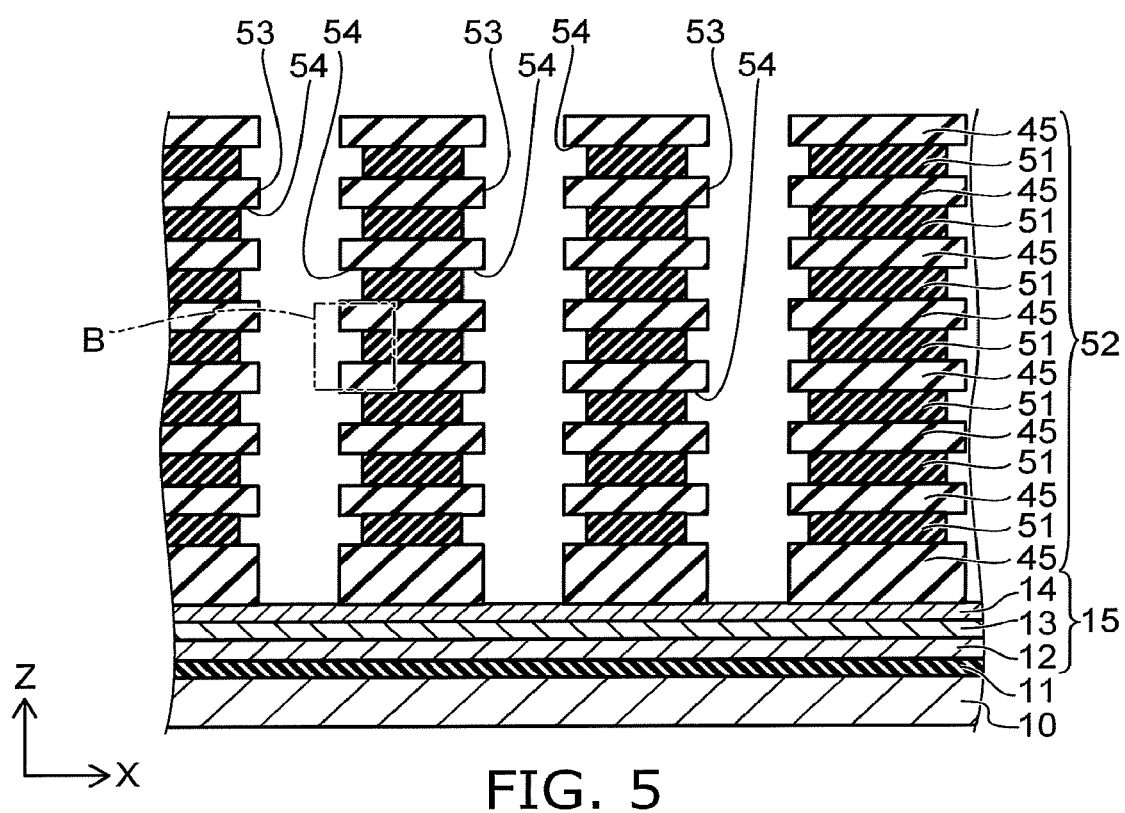

Then, as shown in FIG. 5, isotropic etching of the sacrificial films 51 is performed via the memory trenches 53. For example, wet etching using hot phosphoric acid as the etchant is performed. Thereby, a portion of the sacrificial films 51 is removed; and the exposed regions of the sacrificial films 51 recede at the side surfaces of the memory trenches 53. As a result, recesses 54 that extend in the Y-direction are formed in the side surfaces of the memory trenches 53. FIG. 6 to FIG. 9 described below show a region corresponding to region B of FIG. 5.

Figure 6:
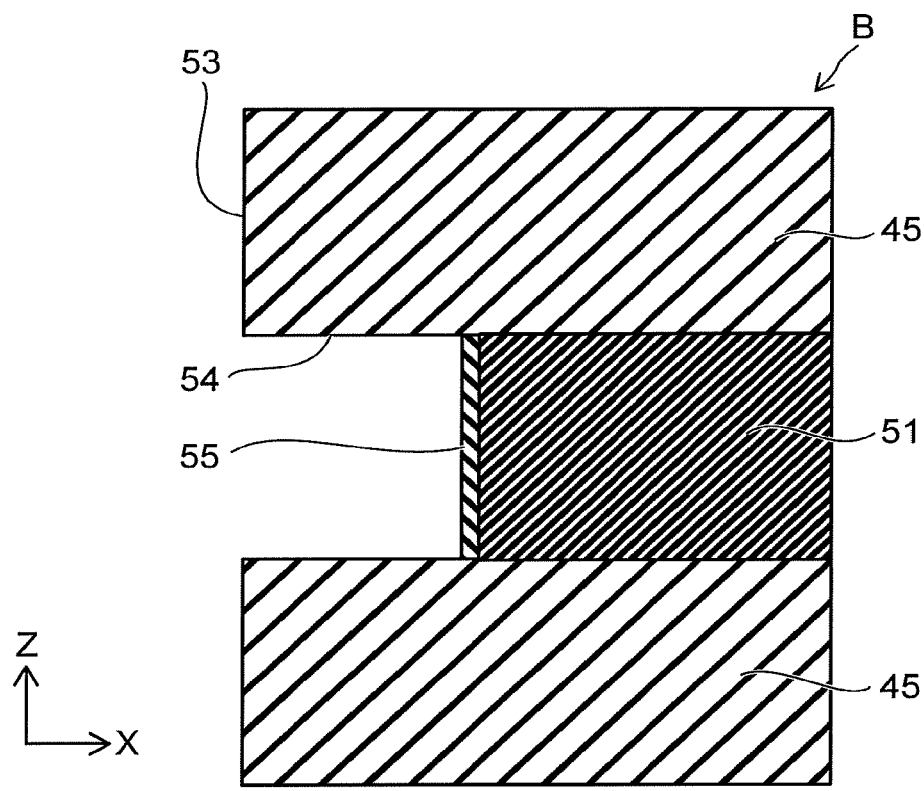

Then, as shown in FIG. 6, a cover layer 55 that is made of silicon oxide is formed on the exposed surface of the sacrificial film 51 inside the recess 54 by performing, for example, thermal oxidation treatment. The cover layer 55 may be formed by depositing silicon oxide using CVD (chemical vapor deposition), etc.

Figure 7:
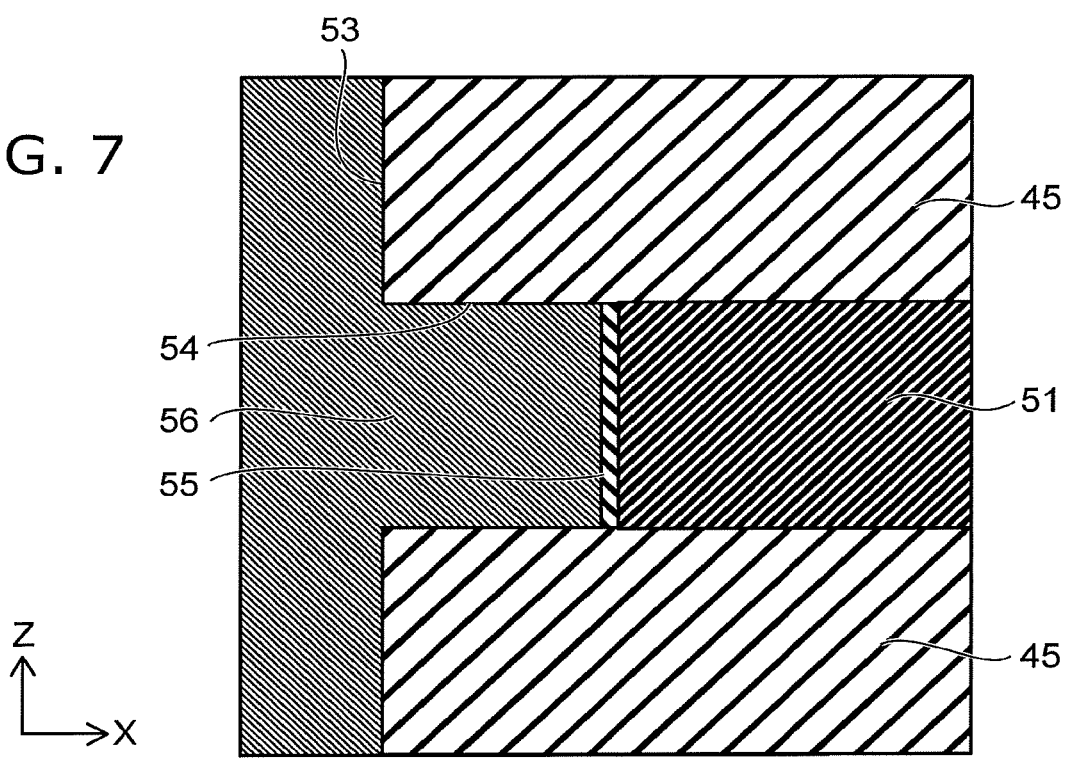

Then, as shown in FIG. 7, a silicon film 56 is formed on the inner surface of the memory trench 53 by depositing amorphous silicon using CVD, etc. The silicon film 56 is filled also into the recess 54.

Figure 8:
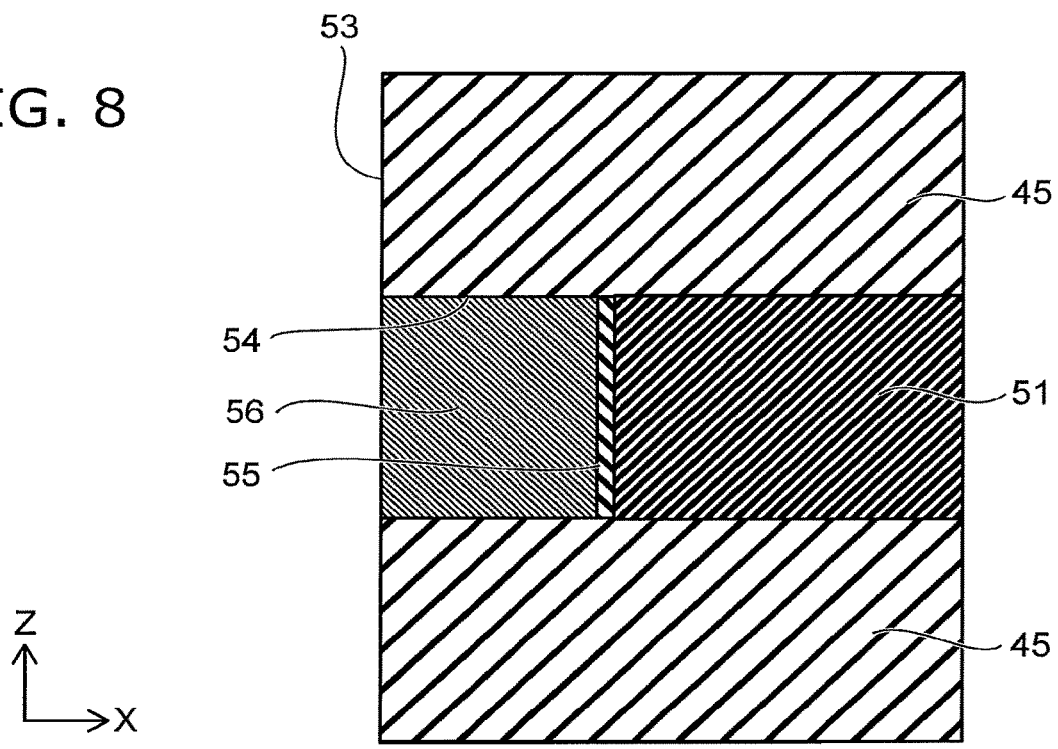

Then, as shown in FIG. 8, by performing etch-back of the silicon film 56, the portion of the silicon film 56 disposed outside the recess 54 is removed; and the portion of the silicon film 56 disposed inside the recess 54 is caused to remain.

Figure 9:
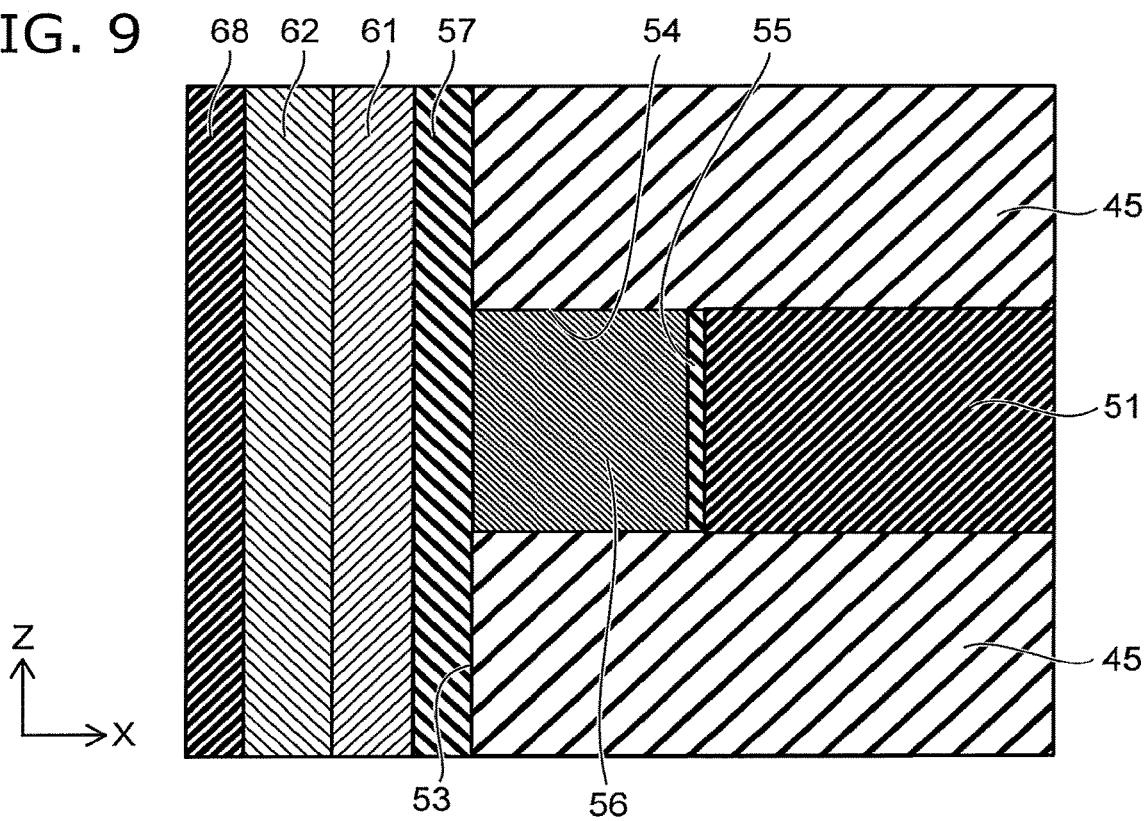

Then, as shown in FIG. 9, a silicon oxide film 57 is formed on the inner surface of the memory trench 53 by depositing silicon oxide using, for example, CVD, etc. Then, a silicon film 61 is formed on the silicon oxide film 57 by depositing amorphous silicon using CVD, etc. At this time, the silicon film 61 does not fill the entire memory trench 53.

Then, anisotropic etching of RIE (Reactive Ion Etching) or the like of the silicon film 61 and the silicon oxide film 57 is performed. Thereby, the silicon film 61 and the silicon oxide film 57 that are on the bottom surface of the memory trench 53 are removed; and the cell source line 15 is exposed. At this time, the portion of the silicon oxide film 57 disposed on the side surface of the memory trench 53 is protected by the silicon film 61 and therefore is not easily damaged by the anisotropic etching.

Then, a silicon film 62 is formed on the silicon film 61 by depositing amorphous silicon using CVD, etc. At this time, the silicon film 62 does not fill the entire memory trench 53. The silicon film 62 contacts the cell source line 15 at the bottom surface of the memory trench 53. Then, an insulating member 68 is formed inside the memory trench 53 by depositing, for example, silicon oxide.

Figure 10:
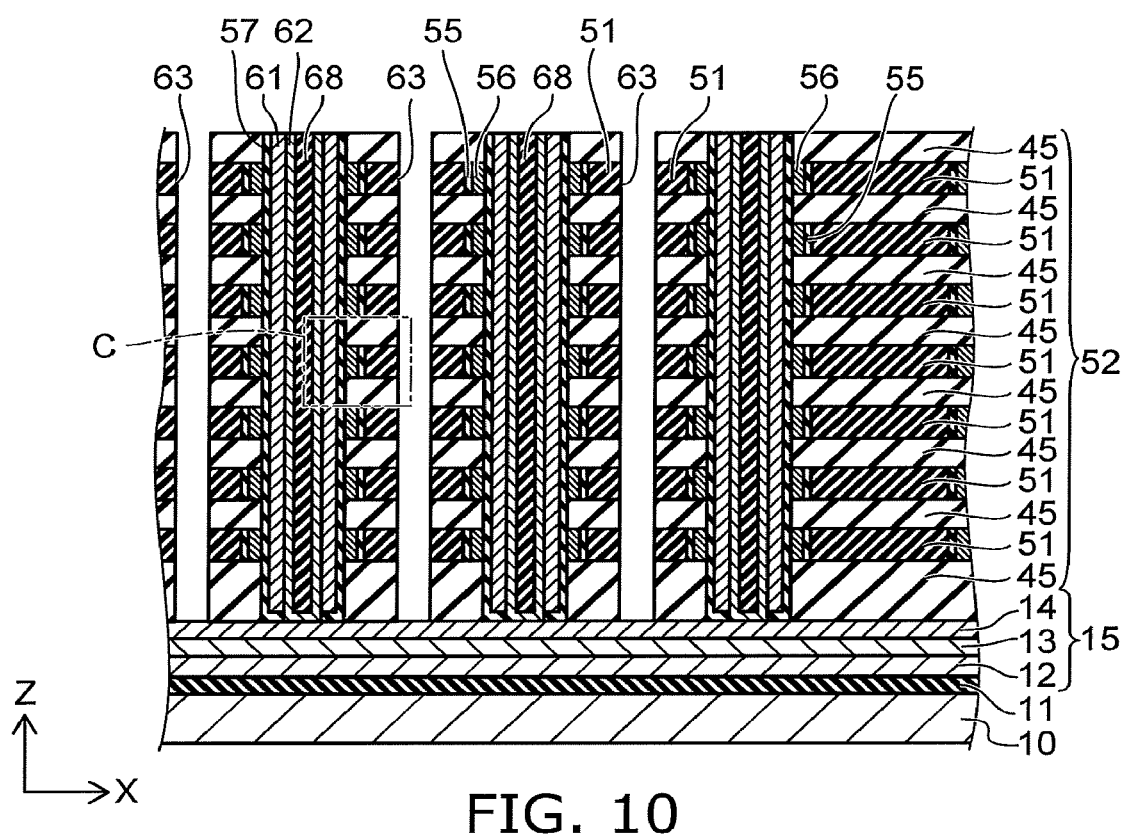

Then, as shown in FIG. 10, slits 63 that extend in the Y-direction are formed in portions of the stacked body 52 between the memory trenches 53 by performing, for example, RIE. The slits 63 pierce the stacked body 52. FIG. 11 to FIG. 15 described below show a region corresponding to region C of FIG. 10.

Figure 11:
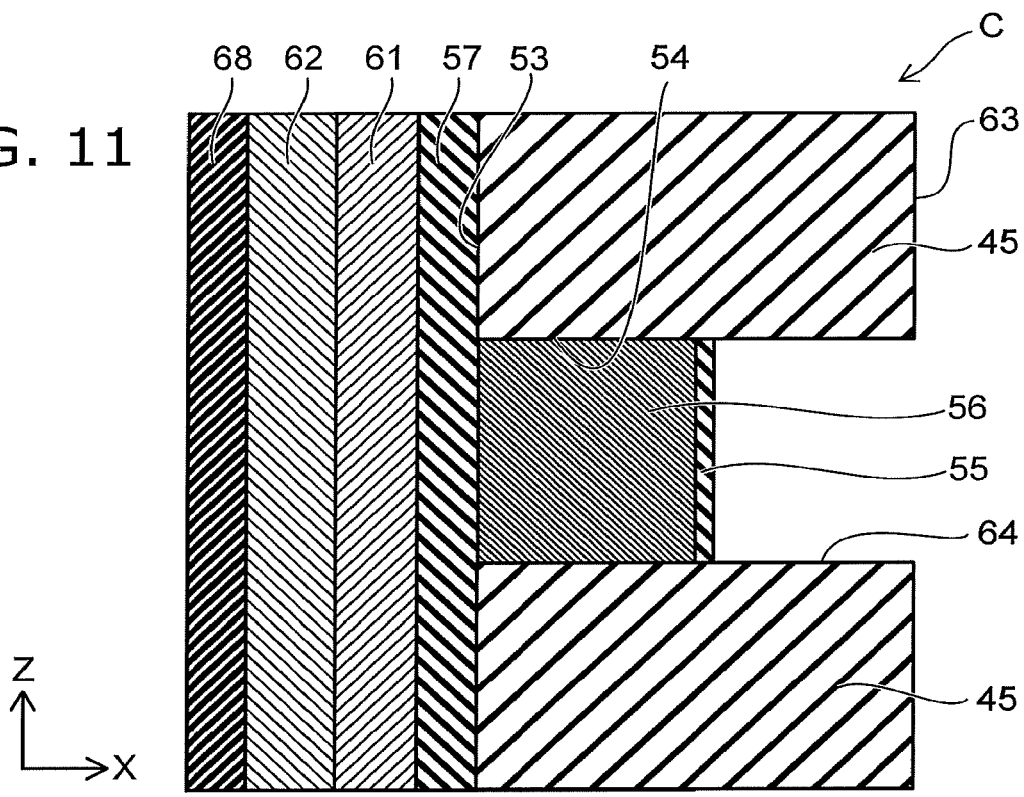

Then, as shown in FIG. 11, isotropic etching of the sacrificial films 51 is performed via the slits 63 (referring to FIG. 10) using the cover layer 55 as a stopper. For example, wet etching is performed using hot phosphoric acid as the etchant. Thereby, the sacrificial film 51 is removed; and a recess 64 that extends in the Y-direction is formed in the side surface of the slit 63. The cover layer 55 is exposed at the back surface of the recess 64.

Figure 12:
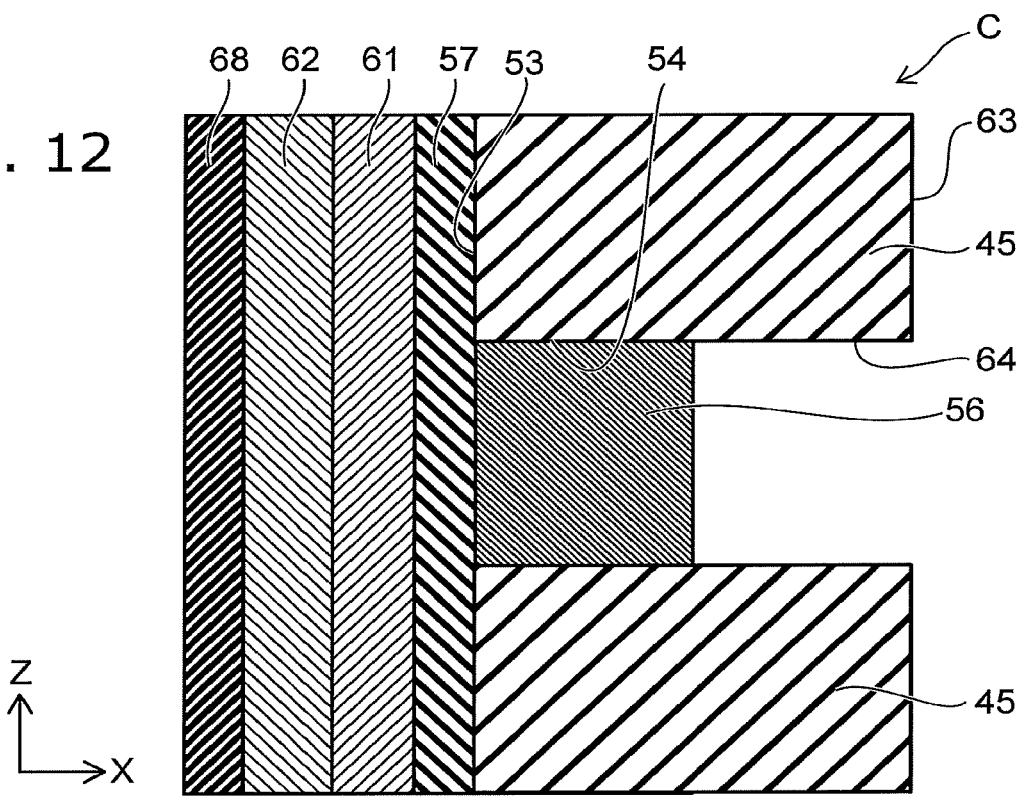

Then, as shown in FIG. 12, the cover layer 55 that is made of silicon oxide and is on the back surface of the recess 64 (referring to FIG. 11) is removed via the slit 63 by performing wet etching using, for example, DHF (diluted hydrofluoric acid) as the etchant. Thereby, the silicon film 56 is exposed at the back surface of the recess 64. At this time, although the exposed surfaces of the inter-layer insulating films 45 made of silicon oxide also are etched somewhat, this is not illustrated.

Figure 13:
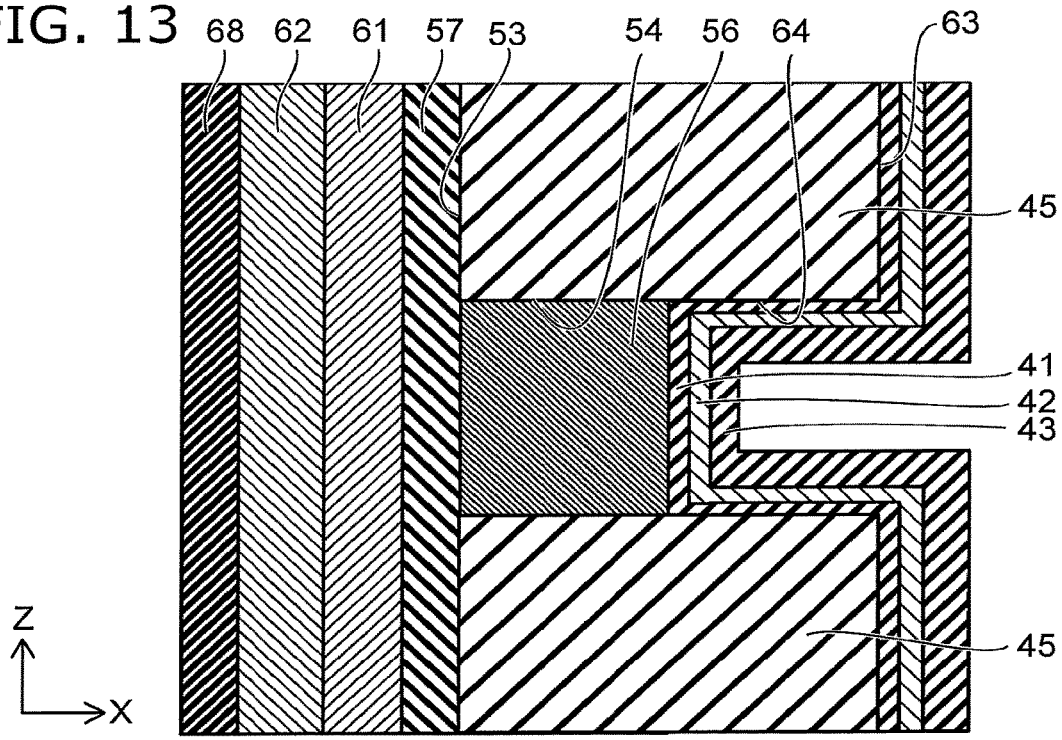

Then, as shown in FIG. 13, the inter-electrode insulating film 41 is formed via the slit 63 by, for example, depositing silicon oxide or silicon nitride using CVD. The inter-electrode insulating film 41 is formed on the inner surface of the recess and on the inner surface of the slit 63. Then, the conductive film 42 is formed on the side surface of the inter-electrode insulating film 41 by depositing ruthenium using sputtering, CVD, etc. Then, the blocking insulating film 43 is formed on the side surface of the conductive film 42 by, for example, depositing hafnium oxide, silicon oxide, and hafnium oxide in this order using CVD. At this time, the blocking insulating film 43 does not fill the entire interior of the recess 64.

Figure 14:
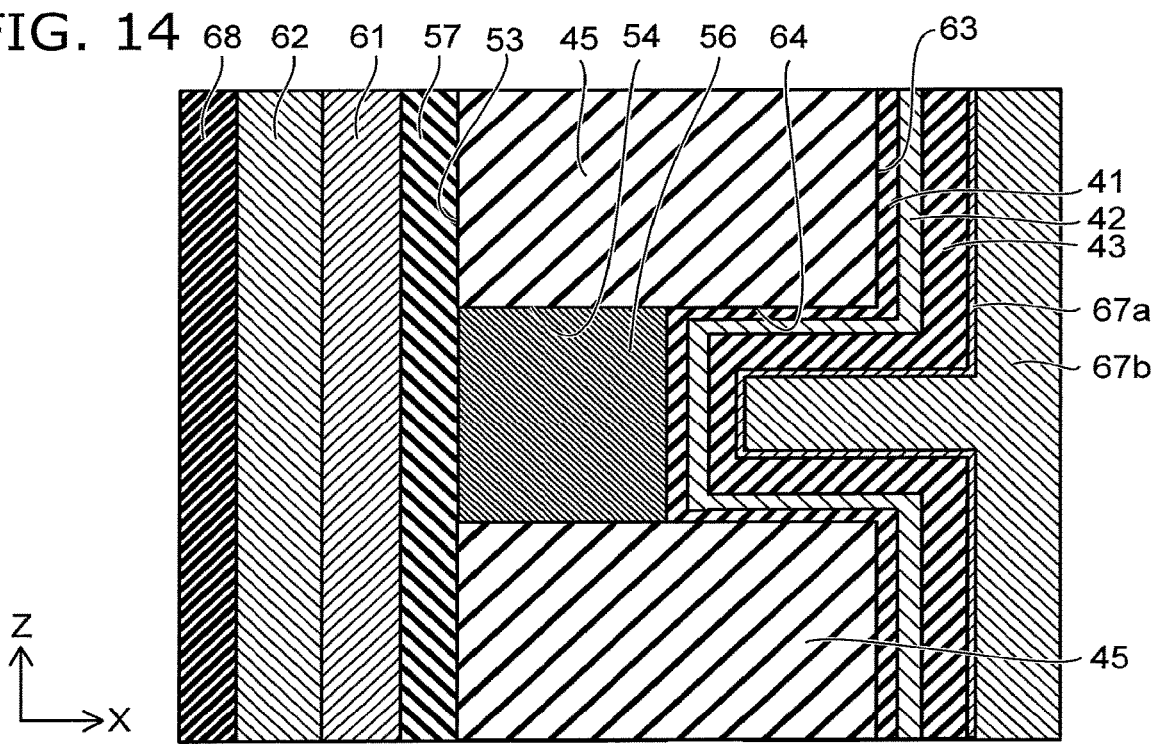

Then, as shown in FIG. 14, for example, titanium nitride (TiN) is deposited inside the slit 63 using CVD. Thereby, a titanium nitride layer 67a is formed on the side surface of the blocking insulating film 43. Then, for example, tungsten is deposited inside the slit 63 using CVD. Thereby, a tungsten film 67b is formed on the side surface of the titanium nitride layer 67a. The tungsten film 67b is filled into the entire interior of the recess 64.

Figure 15:
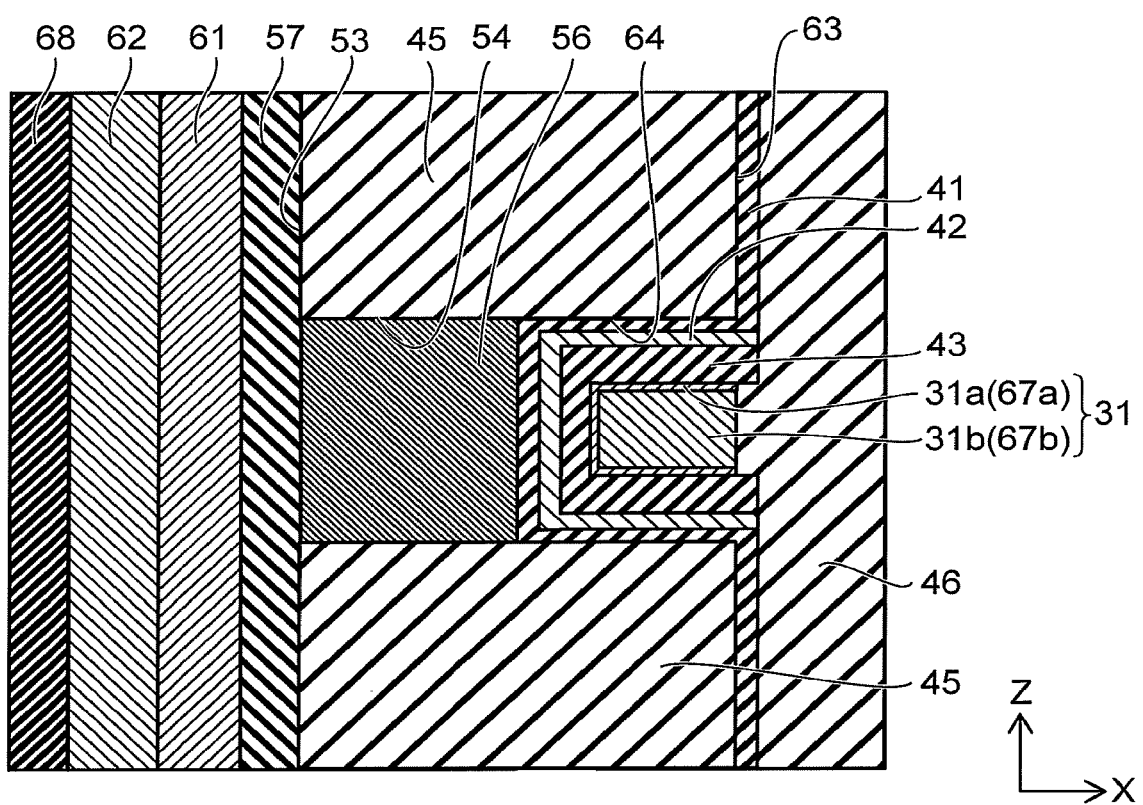

Then, as shown in FIG. 15, etch-back of the tungsten film 67b and the titanium nitride layer 67a is performed via the slit 63. Thereby, the portions of the tungsten film 67b and the titanium nitride layer 67a disposed inside the recess 64 are caused to remain; and the portions of the tungsten film 67b and the titanium nitride layer 67a disposed outside the recess 64 are removed. As a result, the control gate electrode 31 is formed inside each of the recesses 64. At this time, the titanium nitride layer 67a becomes the barrier metal layer 31a; and the tungsten film 67b becomes the main portion 31b.

Then, etch-back of the blocking insulating film 43 is performed via the slit 63. Thereby, the portion of the blocking insulating film 43 disposed inside the recess 64 is caused to remain; and the portion of the blocking insulating film 43 disposed outside the recess 64 is removed. Thereby, the blocking insulating film 43 is divided every recess 64. Further, at this time, the control gate electrode 31 also is etched somewhat; and the exposed region of the control gate electrode 31 at the side surface of the slit 63 recedes from the exposed region of the blocking insulating film 43.

Then, etch-back of the conductive film 42 is performed via the slit 63. Thereby, the portion of the conductive film 42 disposed inside the recess 64 is caused to remain; and the portion of the conductive film 42 disposed outside the recess 64 is removed. Thereby, the conductive film 42 is divided every recess 64. Then, the insulating member 46 is formed inside the slit 63 by depositing silicon oxide.

Figure 16:
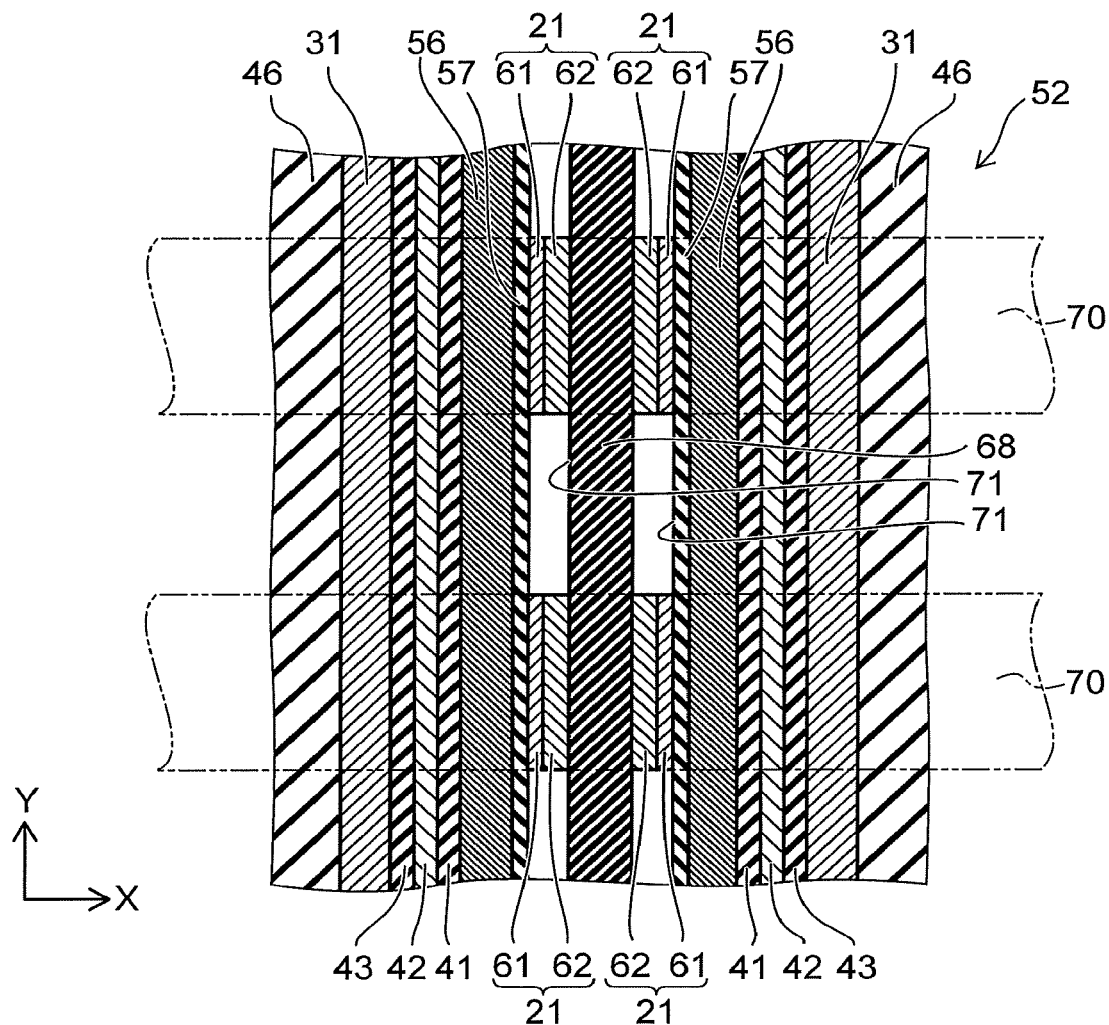
Figure 17:
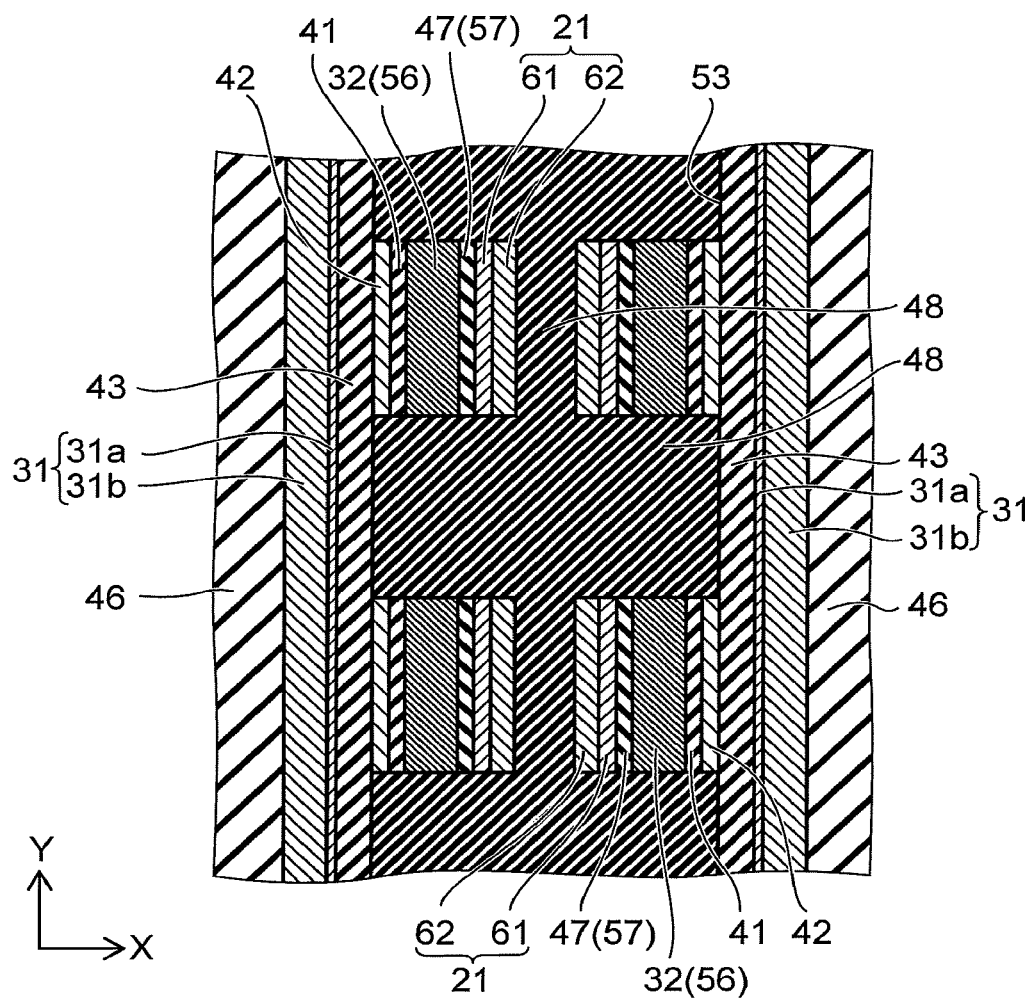

Then, as shown in FIG. 16, a mask pattern 70, in which lines-and-spaces extend in the X-direction and are repeated along the Y-direction, is formed on the stacked body 52. FIG. 16 and FIG. 17 are XY cross-sectional views. Also, the mask pattern 70 is illustrated by double dot-dash lines in FIG. 16.

Then, anisotropic etching such as RIE or the like is performed using the mask pattern 70 as a mask at conditions such that silicon can be etched selectively. Thereby, the silicon pillars 21 are formed by the silicon film 61 and the silicon film 62 being divided along the Y-direction. The lower end portions of the two silicon pillars 21 adjacent to each other in the X-direction are connected to each other because the portion of the silicon film 62 disposed in the region directly under the insulating member 68 is not removed. Also, the region where the silicon film 61 and the silicon film 62 are removed becomes a space 71.

Then, as shown in FIG. 17, isotropic etching such as wet etching or the like is performed via the space 71. Thereby, the insulating member 68, the silicon oxide film 57, the silicon film 56, the inter-electrode insulating film 41, the conductive film 42, and the inter-layer insulating films 45 are selectively removed and divided along the Y-direction. The silicon oxide film 57 becomes the tunneling insulating films 47 by being divided along the Y-direction. The silicon film 56 becomes the floating gate electrodes 32 by being divided along the Y-direction. Then, the mask pattern 70 (referring to FIG. 16) is removed. Then, the insulating member 48 is formed inside the memory trench 53 by depositing silicon oxide.

Then, as shown in FIG. 1A and FIG. 1B, a slit that extends in the Y-direction and reaches the cell source line 15 is formed inside a portion of the insulating member 46. Then, the source electrode 16 is formed inside the slit by filling, for example, a conductive material such as tungsten, etc. Also, the connection member 24 is formed on the pillar pair 22 and connected to the pillar pair 22. Then, the connection member 24 is buried in an inter-layer insulating film 49. Then, the plug 25 is formed inside the inter-layer insulating film 49 and connected to the connection member 24. Then, the bit line 26 is formed on the inter-layer insulating film 49 and connected to the plug 25. Thus, the semiconductor memory device 1 according to the embodiment is manufactured.

Effects of the embodiment will now be described.

In the semiconductor memory device 1 according to the embodiment as shown in FIG. 2, the conductive film 42 that is made of ruthenium is provided between the floating gate electrode 32 and the control gate electrode 31. Therefore, the electrons that are injected from the silicon pillar 21 via the tunneling insulating film 47 can be stopped effectively by the conductive film 42. Thereby, even in the case where the floating gate electrode 32 is formed to be thin in the X-direction, the electrons that pass through the floating gate electrode 32 and enter the blocking insulating film 43 are suppressed; and the injection efficiency of the electrons into the charge storage member made of the floating gate electrode 32 and the conductive film 42 can be maintained to be high. Also, the work function of the conductive film 42 is higher than the work function of the floating gate electrode 32 because the work function of the ruthenium included in the conductive film 42 is about 4.68 eV and the work function of the silicon included in the floating gate electrode 32 is about 4.15 eV. Thereby, the retention of the injected electrons is high; accordingly, the data retention characteristics of the memory cells are good.

Also, in the embodiment, because the conductive film 42 is formed as a continuous film, the electrons that are injected via the tunneling insulating film 47 can be stopped more effectively.

Further, in the embodiment, the retention of the electrons is high because the conductive film 42 is divided every floating gate electrode 32.

Further, in the method for manufacturing the semiconductor memory device according to the embodiment, the silicon oxide film 57 (the tunneling insulating film 47) is formed from the memory trench 53 side as shown in FIG. 9. On the other hand, as shown in FIG. 13, the conductive film 42 is formed from the slit 63 side. Therefore, the floating gate electrode 32 and the inter-electrode insulating film 41 are interposed between the tunneling insulating film 47 and the conductive film 42; and the conductive film 42 does not contact the tunneling insulating film 47. As a result, the degradation of the tunneling insulating film 47 due to the metallic elements included in the conductive film 42 can be prevented. Also, the metallic elements can be prevented from diffusing inside the silicon pillar 21 via the tunneling insulating film 47; and junction leakages caused by the diffused metallic elements can be prevented from occurring. As a result, a semiconductor memory device can be obtained in which the reliability is high.

Although an example is shown in the embodiment in which the conductive film 42 is formed of ruthenium (Ru), the material of the conductive film 42 is not limited thereto; it is sufficient for the material of the conductive film 42 to be a metal having a work function higher than the work function of silicon (4.15 eV); and it is more favorable for the material of the conductive film 42 to be a metal having a work function higher than, for example, 4.5 eV. For example, as the material of the conductive film 42, a metal, a metal nitride, or a metal silicide may be used; and platinum (Pt), iridium (Ir), or titanium nitride may be used.

A second embodiment will now be described.

Figure 18:
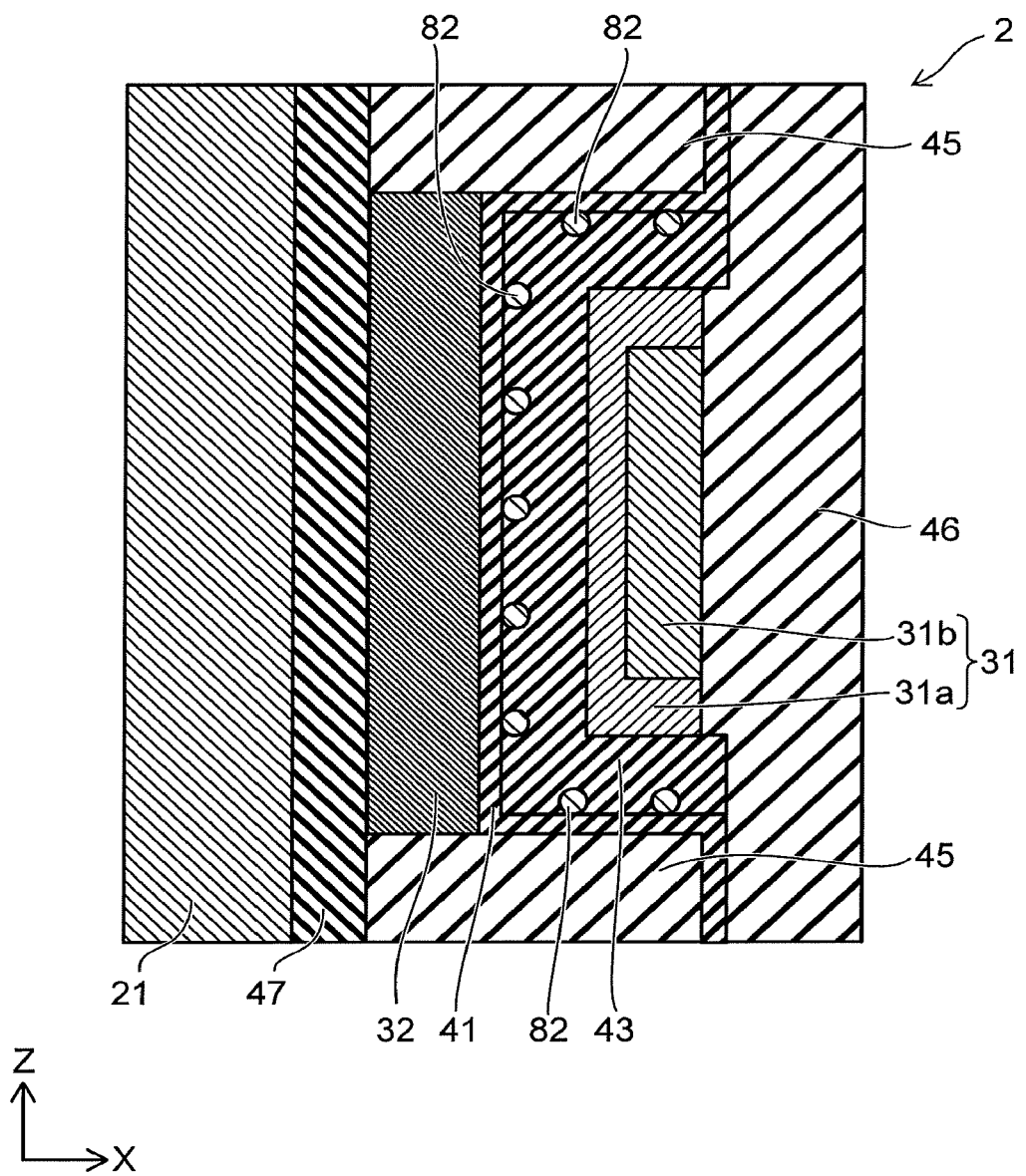
FIG. 18 is a cross-sectional view showing a semiconductor memory device according to a second embodiment.

FIG. 18 is a cross-sectional view showing a semiconductor memory device according to the embodiment.

FIG. 18 shows a region corresponding to region A of FIG. 1A.

As shown in FIG. 18, the semiconductor memory device 2 according to the embodiment differs from the semiconductor memory device 1 according to the first embodiment described above (referring to FIG. 2) in that a conductive film 82 that includes multiple mutually-separated granular portions is provided instead of the conductive film 42 which is a continuous film. The conductive film 82 is made of, for example, ruthenium and is a discontinuous film in which many island-like portions are clustered. "Discontinuous film" also includes a form in which multiple island-like portions are clustered inside a space having a planar configuration or a curved-surface configuration that has a thickness. The island-like portions may be separated from each other. In such a case, it is sufficient for each of the island-like portions to be formed of a conductive material even if a current cannot be caused to flow in the conductive film 82 as an entirety. In the specification, "conductive film" is defined to include both continuous films and discontinuous films; and "discontinuous film" also includes a cluster body of multiple mutually-separated conductive granular portions.

According to the embodiment, compared to the first embodiment described above, the total amount of the metal material, e.g., ruthenium, for forming the conductive film 82 can be reduced; and the material cost and the film formation cost can be reduced. Even if the conductive film 82 is not a continuous film, the capability of stopping the electrons injected via the tunneling insulating film 47 and the capability of retaining the injected electrons do not degrade much compared to the conductive film 42 which is a continuous film.

Otherwise, the configuration, the manufacturing method, and the effects of the embodiment are similar to those of the first embodiment described above.

In the process of etching using the mask shown in FIG. 17, the case also may be considered where selective removal up to the inter-electrode insulating film 41 and the conductive film 42 is not performed after the silicon film 56 is selectively removed to divide the silicon film 56 along the Y-direction. For example, in the case where the inter-electrode insulating film 41 and the conductive film 42 (82) are not divided in the process of etching shown in FIG. 17, the conductive material of the conductive film 42 (82) can be prevented from diffusing into the silicon pillar 21 in the dividing process.

A third embodiment will now be described.

Figure 19:
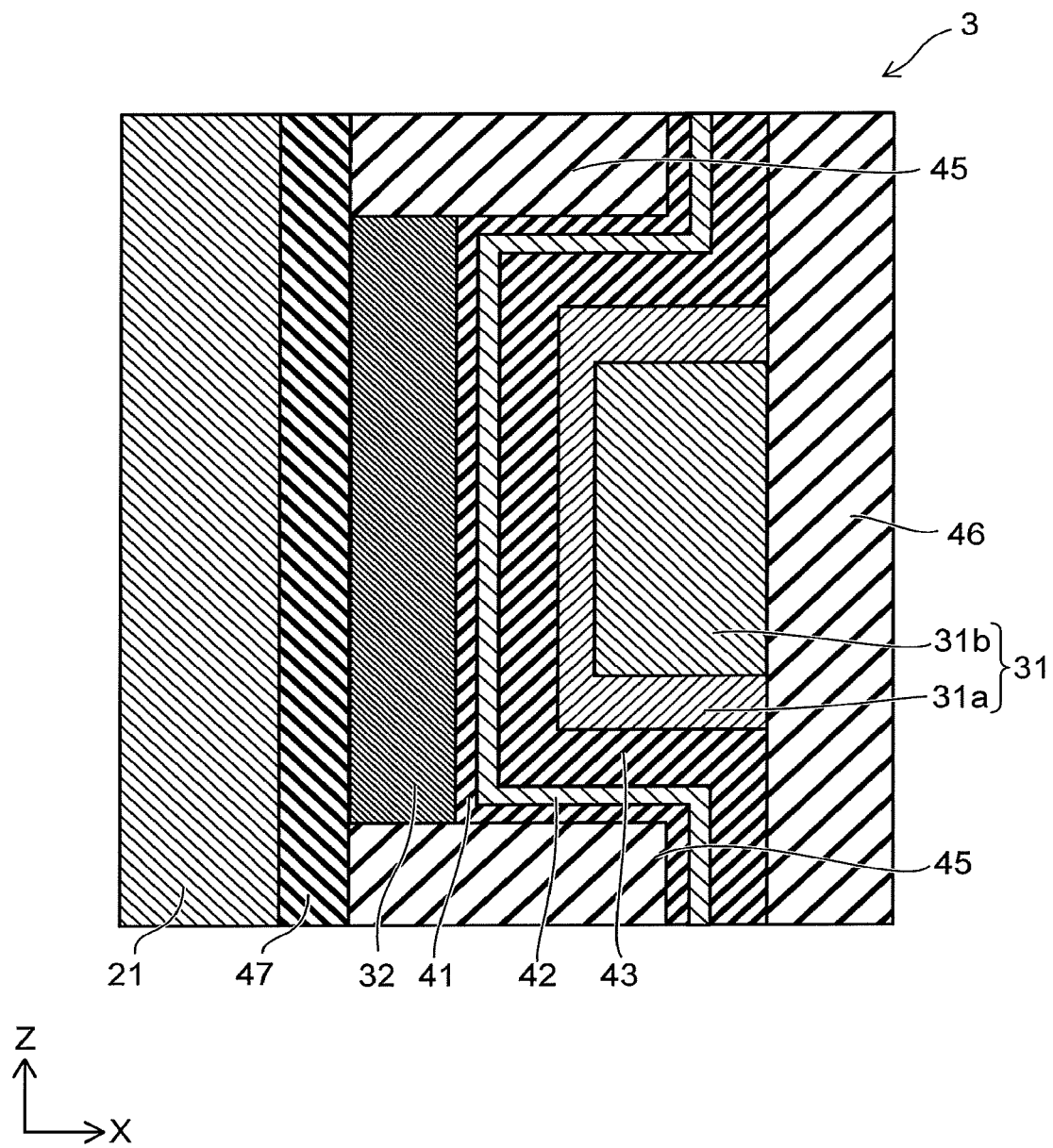
FIG. 19 is a cross-sectional view showing a semiconductor memory device according to a third embodiment.

FIG. 19 is a cross-sectional view showing a semiconductor memory device according to the embodiment.

FIG. 19 shows a region corresponding to region A of FIG. 1A.

As shown in FIG. 19, the semiconductor memory device 3 according to the embodiment differs from the semiconductor memory device 1 according to the first embodiment described above (referring to FIG. 2) in that the conductive film 42 and the blocking insulating film 43 are disposed also between the inter-layer insulating film 45 and the insulating member 46. The semiconductor memory device 3 that has such a configuration can be manufactured by not performing etch-back of the blocking insulating film 43 and the conductive film 42 after the etch-back of the control gate electrode 31 in the process shown in FIG. 15.

According to the embodiment, compared to the first embodiment, the manufacturing cost can be reduced because the etch-back of the blocking insulating film 43 and the conductive film 42 can be omitted. In the embodiment, there is a risk of movement of electrons between the memory cell transistors adjacent to each other in the Z-direction by being conducted through the conductive film 42 because the conductive film 42 is not divided. However, the movement of the electrons between the memory cells is small enough not to be a practical problem because the conductive film 42 is curved to detour around the inter-layer insulating film 45 between the memory cells.

Otherwise, the configuration, the manufacturing method, and the effects of the embodiment are similar to those of the first embodiment described above.

A fourth embodiment will now be described.

Figure 20:
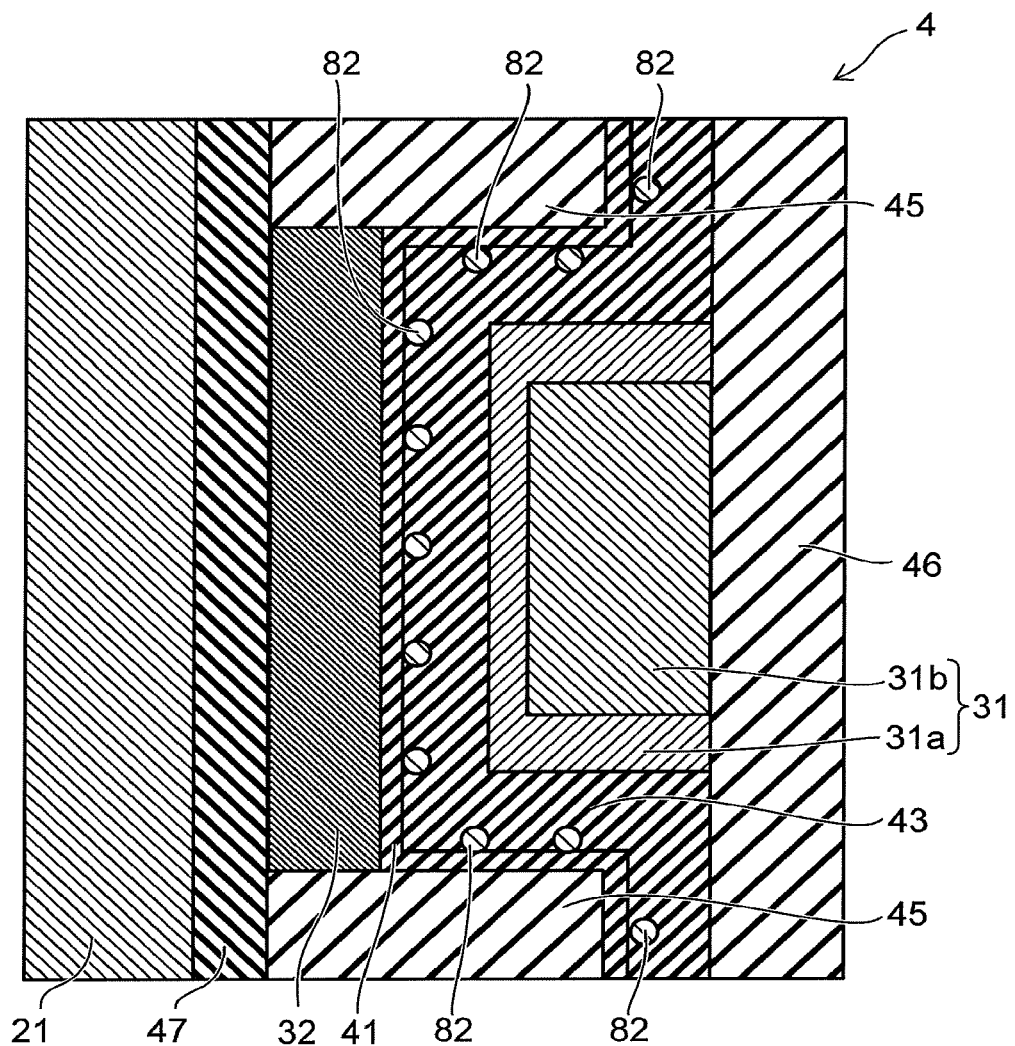
FIG. 20 is a cross-sectional view showing a semiconductor memory device according to a fourth embodiment.

FIG. 20 is a cross-sectional view showing a semiconductor memory device according to the embodiment.

FIG. 20 shows a region corresponding to region A of FIG. 1A.

As shown in FIG. 20, the semiconductor memory device 4 according to the embodiment is an example in which the second embodiment (referring to FIG. 18) and the third embodiment (referring to FIG. 19) described above are combined. In other words, the semiconductor memory device 4 according to the embodiment differs from the semiconductor memory device 1 according to the first embodiment (referring to FIG. 2) in that the discontinuous conductive film 82 is provided instead of the continuous conductive film 42; and the conductive film 42 and the blocking insulating film 43 are disposed also between the inter-layer insulating film 45 and the insulating member 46.

According to the embodiment, similarly to the third embodiment, the manufacturing cost can be reduced because the etch-back of the blocking insulating film 43 and the conductive film 82 can be omitted. Also, because the conductive film 82 is a discontinuous film, the material cost and film formation cost of the conductive film 82 can be reduced; and the conduction of the electrons through the conductive film 82 between the memory cell transistors adjacent to each other in the Z-direction can be suppressed. Therefore, compared to the third embodiment, the retention characteristics of the data are good.

Otherwise, the configuration, the manufacturing method, and the effects of the embodiment are similar to those of the first embodiment described above.

A fifth embodiment will now be described.

Figure 21:
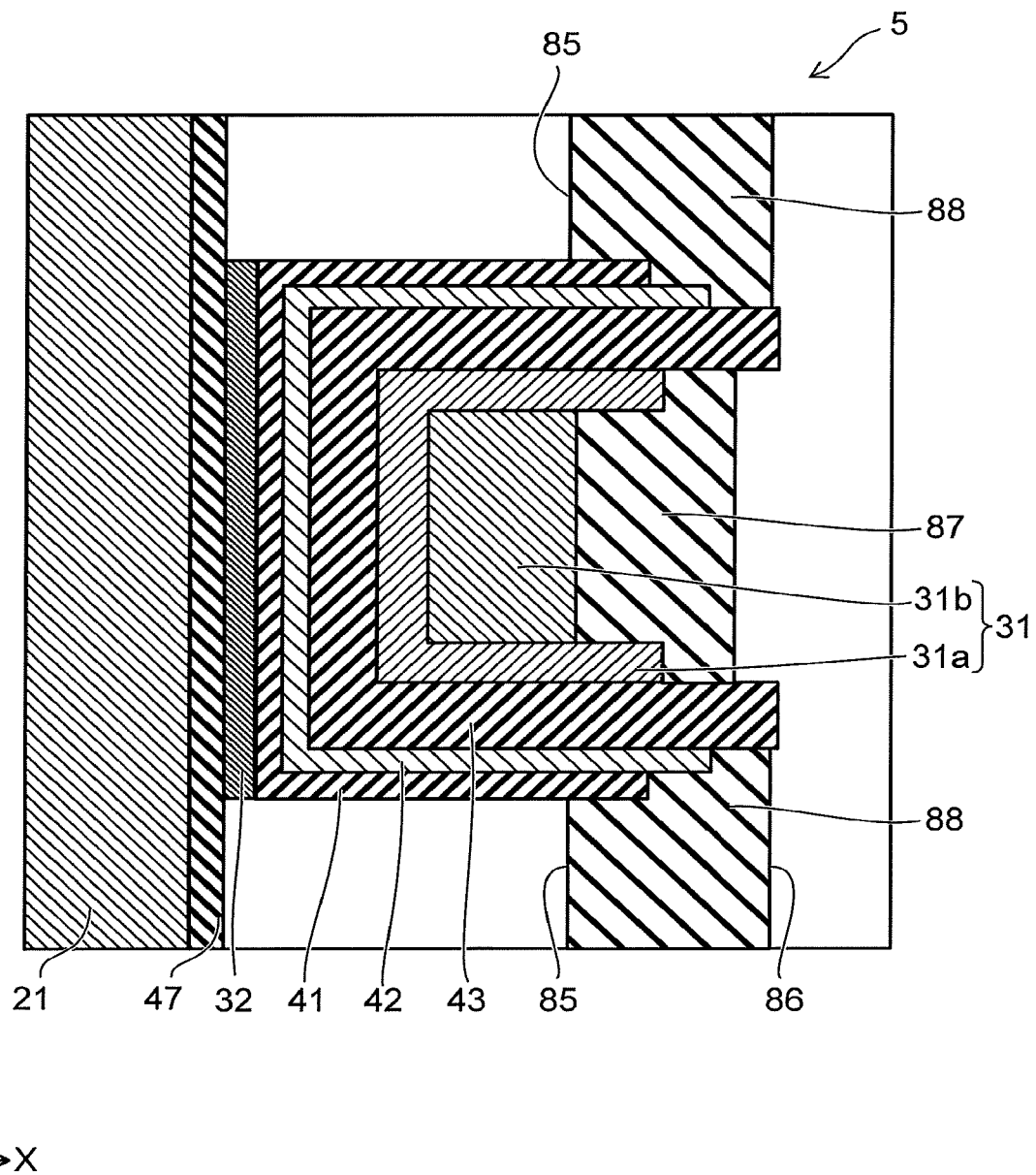
FIG. 21 is a cross-sectional view showing a semiconductor memory device according to a fifth embodiment.

FIG. 21 is a cross-sectional view showing a semiconductor memory device according to the embodiment.

FIG. 21 shows a region corresponding to region A of FIG. 1A.

As shown in FIG. 21, the semiconductor memory device 5 according to the embodiment differs from the semiconductor memory device 1 according to the first embodiment described above (referring to FIG. 2) in that the inter-layer insulating films 45 are not provided; and an air gap 85 that extends in the Y-direction is formed instead between the inter-electrode insulating films 41 adjacent to each other in the Z-direction. Also, the insulating member 46 is not provided; and an air gap 86 that spreads along the YZ plane is formed instead.

A capping film 87 that is made of, for example, silicon nitride is provided between the control gate electrode 31 and the air gap 86. Also, a capping film 88 that is made of, for example, silicon oxide is provided between the air gap 85 and the air gap 86. A portion of the blocking insulating film 43 is interposed between the capping film 87 and the capping film 88 in the Z-direction. Further, the floating gate electrode 32 is thinner than that of the first embodiment and is, for example, thinner than the tunneling insulating film 47. Also, the floating gate electrode 32 extends in the Y-direction. Further, the conductive film 42 also extends in the Y-direction.

Otherwise, the configuration of the embodiment is similar to that of the first embodiment described above.

A method for manufacturing the semiconductor memory device according to the embodiment will now be described.

FIG. 22 to FIG. 26 are cross-sectional views showing the method for manufacturing the semiconductor memory device according to the embodiment.

Figure 22:
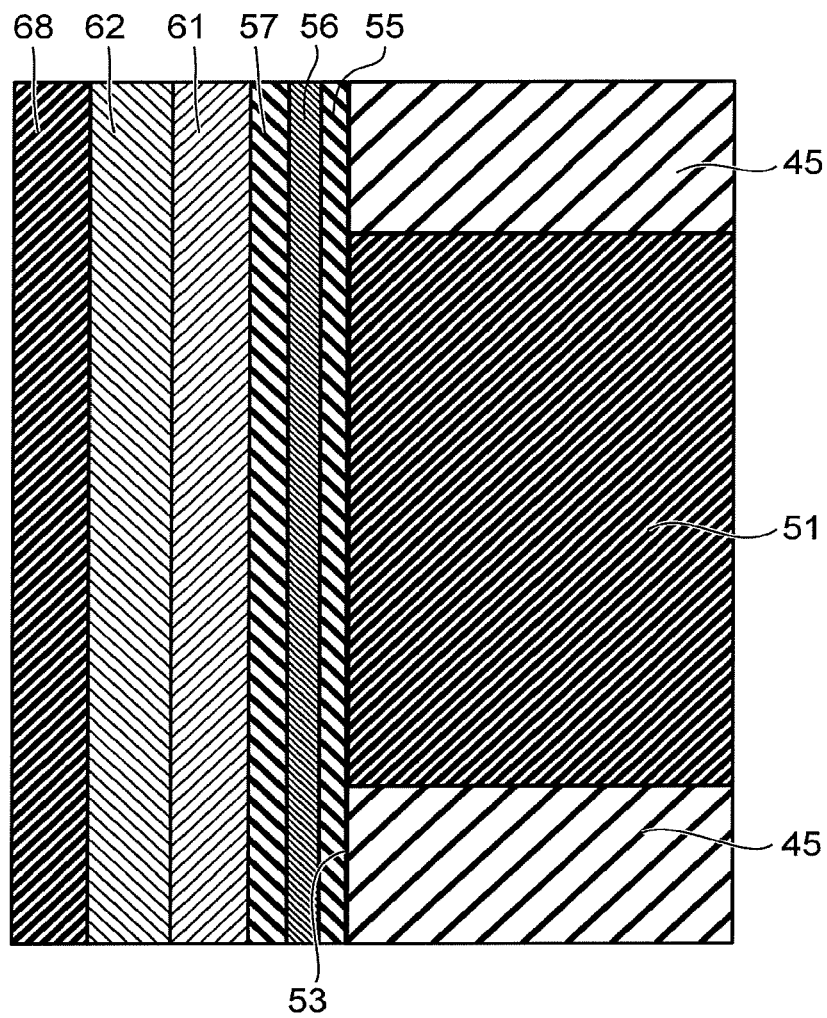
FIG. 22 to FIG. 26 are cross-sectional views showing a method for manufacturing the semiconductor memory device according to the fifth embodiment.
Figure 23:
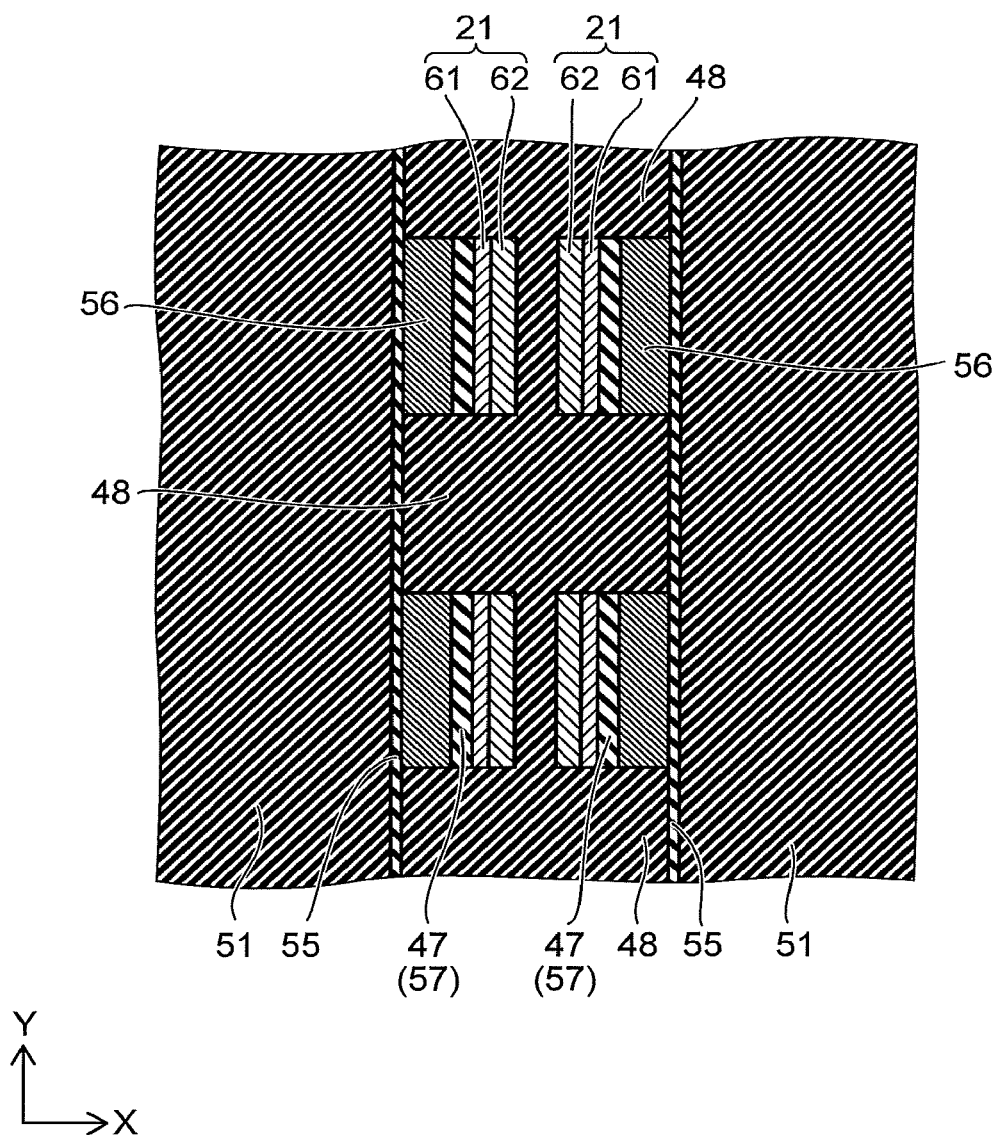

However, FIG. 23 shows the XY cross section. On the other hand, FIG. 22 and FIG. 24 to FIG. 26 show the XZ cross section.

First, the processes shown in FIG. 3 and FIG. 4 are implemented. In other words, the insulating film 11 and the cell source line 15 are formed on the silicon substrate 10. Then, the stacked body 52 is formed by alternately stacking the inter-layer insulating films 45 and the sacrificial films 51. Then, the memory trenches 53 are formed in the stacked body 52.

Then, as shown in FIG. 22, the cover layer 55 made of silicon oxide, the silicon film 56, the silicon oxide film 57, and the silicon film 61 are formed in this order on the side surface of the memory trench 53. Then, the cell source line 15 is exposed at the bottom surface of the memory trench 53 by performing anisotropic etching such as RIE, etc., of the silicon film 61, the silicon oxide film 57, the silicon film 56, and the cover layer 55. Then, the silicon film 62 is formed on the silicon film 61 by depositing amorphous silicon. At this time, the silicon film 62 contacts the cell source line 15 at the bottom surface of the memory trench 53. Then, the insulating member 68 is formed inside the memory trench 53 by depositing, for example, silicon oxide.

Then, as shown in FIG. 23, the mask pattern 70 in which the lines-and-spaces are repeated along the Y-direction (referring to FIG. 16) is formed; and anisotropic etching such as RIE or the like is performed using the mask pattern 70 as a mask. Thereby, the silicon pillars 21 are formed by selectively removing the silicon film 61 and the silicon film 62 to divide the silicon film 61 and the silicon film 62 along the Y-direction. Then, isotropic etching is performed via the space where the silicon films 61 and 62 are removed. Thereby, the insulating member 68, the silicon oxide film 57, and the silicon film 56 are selectively removed to be divided along the Y-direction. The silicon oxide film 57 becomes the tunneling insulating films 47 by being divided along the Y-direction. At this time, the cover layer 55 is not removed. Then, the insulating member 48 is filled into the space formed by the etching.

Figure 24:
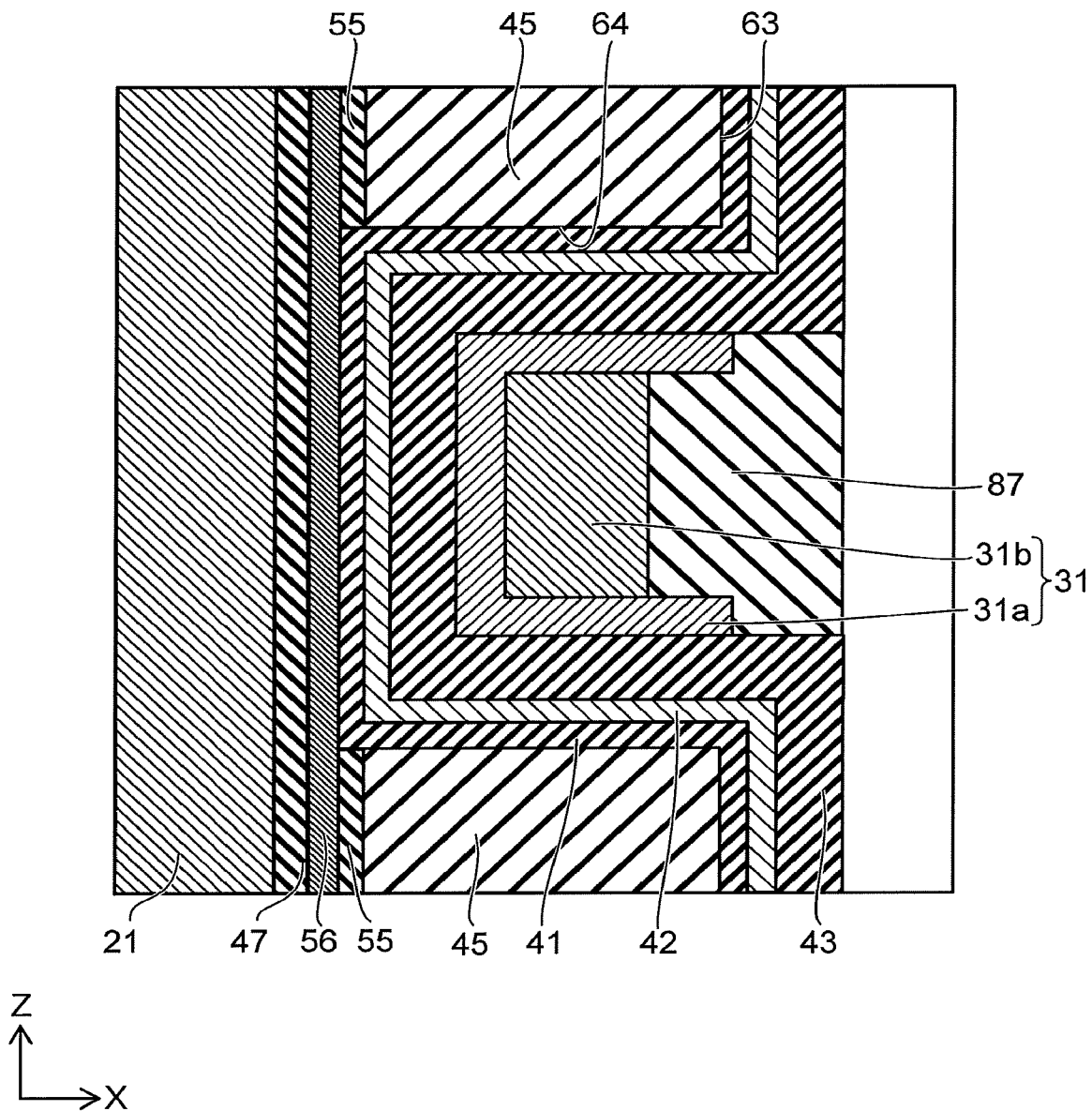

Then, as shown in FIG. 24, the slit 63 that extends in the Y-direction is formed in the stacked body 52. Then, the recess 64 is formed in the side surface of the slit 63 by removing the sacrificial film 51 (referring to FIG. 22) via the slit 63. Then, the portion of the cover layer 55 exposed inside the recess 64 is removed via the slit 63 and the recess 64.

Then, the inter-electrode insulating film 41, the conductive film 42, and the blocking insulating film 43 are formed in this order in the slit 63 and on the inner surface of the recess 64. Then, the titanium nitride layer 67a and the tungsten film 67b are formed. Then, etch-back of the tungsten film 67b and the titanium nitride layer 67a is performed via the slit 63. Thereby, the control gate electrode 31 is formed inside each of the recesses 64. At this time, the titanium nitride layer 67a becomes the barrier metal layer 31a; and the tungsten film 67b becomes the main portion 31b. Then, the capping film 87 that is made of, for example, silicon nitride is formed inside the slit 63. Then, only the portion of the capping film 87 covering the control gate electrode 31 inside the recess 64 is caused to remain by performing etch-back of the capping film 87 via the slit 63.

Figure 25:
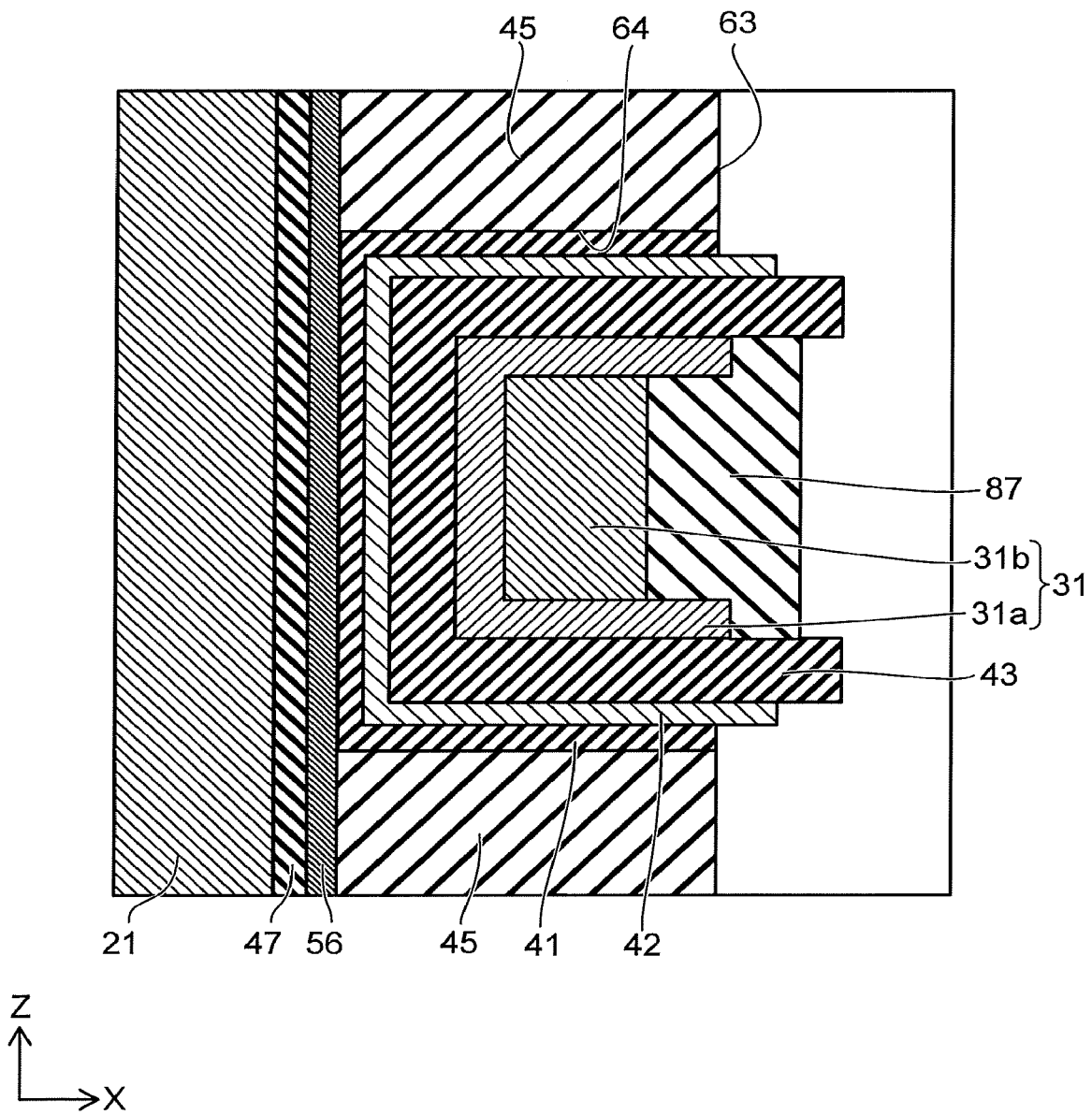

Then, as shown in FIG. 25, etch-back of the blocking insulating film 43, the conductive film 42, and the inter-electrode insulating film 41 is performed via the slit 63. Thereby, the blocking insulating film 43, the conductive film 42, and the inter-electrode insulating film 41 are caused to remain only inside the recess 64.

Figure 26:
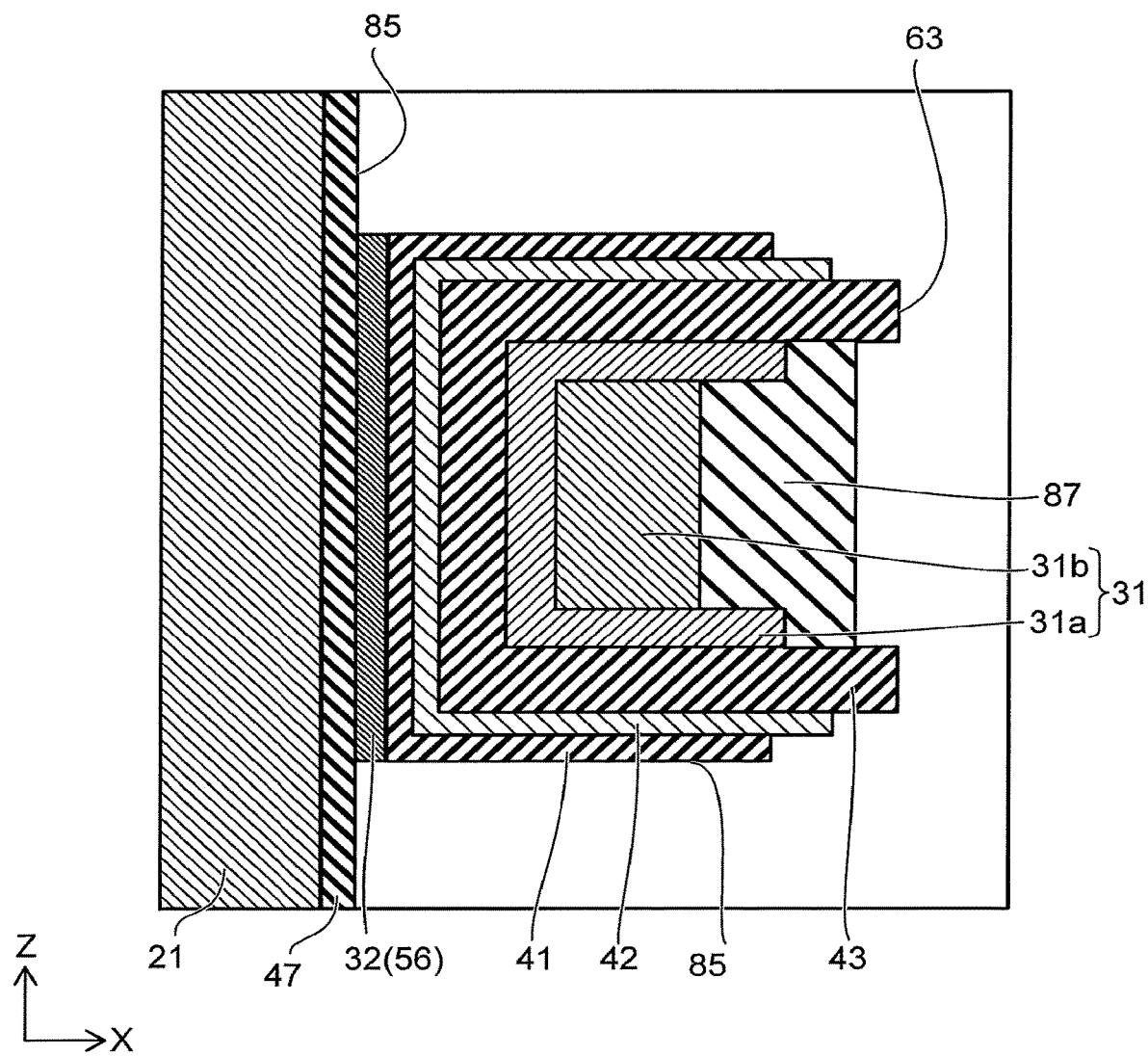

Then, as shown in FIG. 26, the inter-layer insulating films 45 and the cover layer 55 are removed via the slit 63. Thereby, the air gap 85 that communicates with the slit 63 is formed in the space where the inter-layer insulating films 45 and the cover layer 55 are removed. The silicon film 56 is exposed at the back surface of the air gap 85. Then, isotropic etching such as wet etching or the like is performed via the slit 63 and the air gap 85. Thereby, the portion of the silicon film 56 exposed inside the air gap 85 is removed. As a result, the silicon film 56 is divided along the Z-direction to become the multiple floating gate electrodes 32. Instead of the wet etching, the silicon film 56 may be selectively oxidized by performing oxidation treatment; and the unoxidized portions may be used as the floating gate electrodes 32.

Then, as shown in FIG. 21, the capping film 88 that is made of, for example, silicon oxide is formed to partition the air gap 85 from the slit 63. The portion of the slit 63 separated from the air gap 85 becomes the air gap 86.

Thereafter, the manufacturing method is similar to that of the first embodiment described above. Thus, the semiconductor memory device 5 according to the embodiment is manufactured.

Effects of the embodiment will now be described.

In the embodiment as well, similarly to the first embodiment described above, the injection efficiency and retention characteristics of the electrons are high because the conductive film 42 made of ruthenium is provided between the floating gate electrode 32 and the blocking insulating film 43. Also, the silicon oxide film 57 that is used to form the tunneling insulating film 47 is formed from the memory trench 53 side (referring to FIG. 22); and the conductive film 42 is formed from the slit 63 side (referring to FIG. 23); therefore, the conductive film 42 does not contact the tunneling insulating film 47 and does not damage the tunneling insulating film 47.

Additionally, in the embodiment, the silicon film 56 is not patterned when forming the silicon pillars 21 by etching the silicon film 62 and the silicon film 61 in the process shown in FIG. 23. Thereby, the highly difficult patterning of performing etch-back of the silicon film 56 formed on the inner surface of the memory trench 53 to cause the silicon film 56 to remain only inside the recess 54 can be avoided. Then, in the process shown in FIG. 26, the floating gate electrode 32 is formed by etching the silicon film 56 from the slit 63 side to divide the silicon film 56 along the Z-direction. The degree of difficulty of the patterning is low because it is sufficient to selectively remove the thin silicon film 56 using the blocking insulating film 43, etc., as a mask. Thus, in the embodiment, the formation of the floating gate electrode 32 is easy.

In the case where etch-back of the silicon film 56 formed on the inner surface of the memory trench 53 is performed to cause the silicon film 56 to remain only inside the recess 54, it is necessary to form the floating gate electrode 32 to be thick to ensure the margin of the patterning. Conversely, according to the embodiment, the patterning of the floating gate electrode 32 is easy; therefore, the margin of the patterning can be small; and the floating gate electrode 32 can be formed to be thin. As a result, the program operation and erase operation of the memory cells can be faster. Also, the integration of the memory cells can be increased.

Also, in the embodiment, the floating gate electrode 32 is not etched in the process of patterning by etching the silicon pillar 21. Therefore, it is unnecessary to expose the silicon pillar 21 to the etching environment until the floating gate electrode 32 is completely divided as in the case where the silicon pillar 21 and the floating gate electrode 32 are etched simultaneously; therefore, an excessively fine width in the Y-direction of the silicon pillar 21 can be avoided.

Further, in the embodiment, because the floating gate electrode 32 is formed to be thin, the interference between the memory cells can be suppressed; and the operation window of the program operation and the erase operation can be widened. Further, by forming the floating gate electrode 32 to be thin, it is possible to increase the integration of the memory cells.

Further, in the embodiment, the air gap 85 is formed between the memory cells adjacent to each other in the Z-direction; and the air gap 86 is formed between the memory cells adjacent to each other in the X-direction; therefore, the interference between the memory cells can be suppressed. Thereby, the integration of the memory cells can be increased. An insulating material may be filled into the air gap 85 and into the air gap 86.

A sixth embodiment will now be described.

Figure 27:
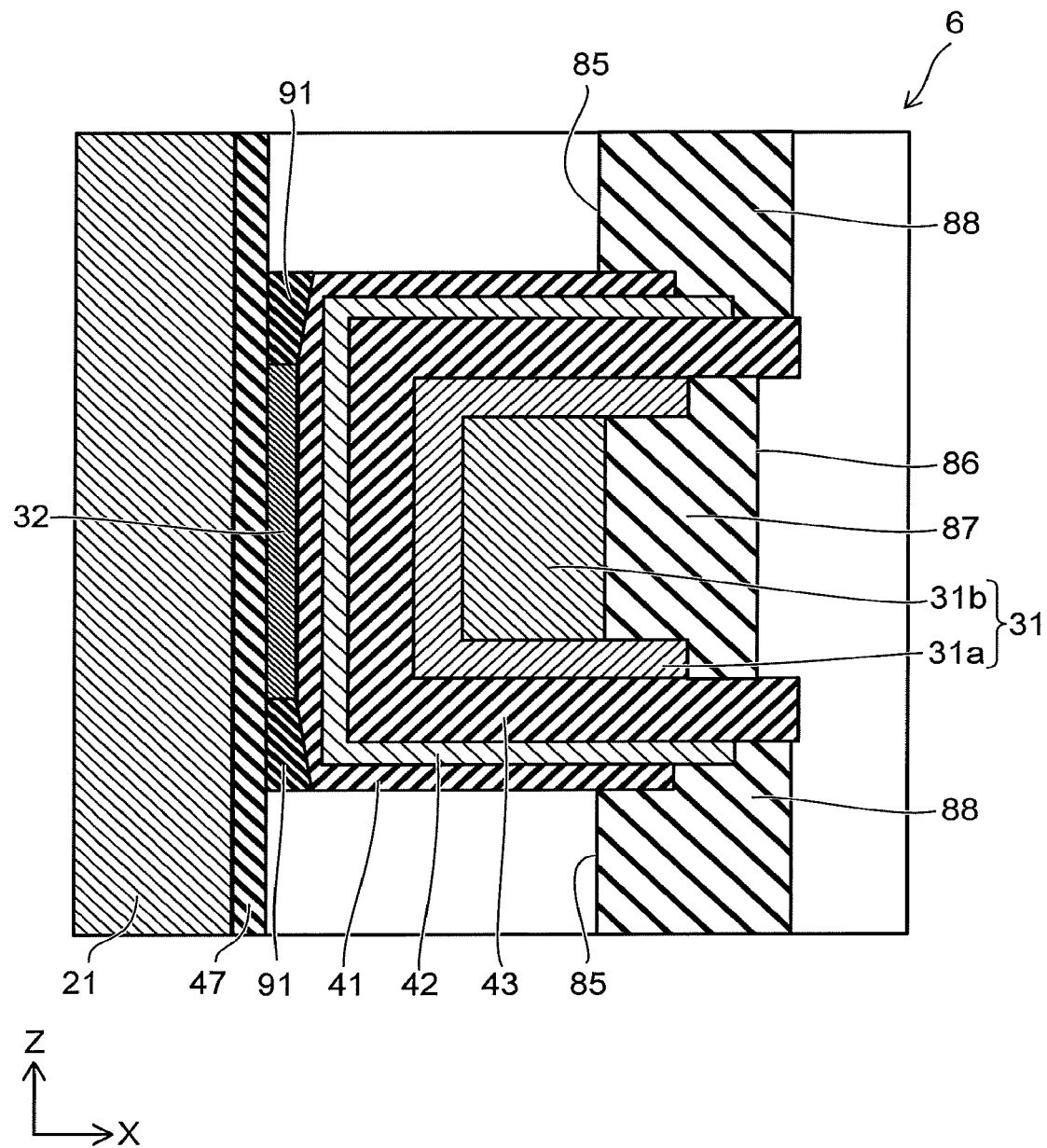
FIG. 27 is a cross-sectional view showing a semiconductor memory device according to a sixth embodiment.

FIG. 27 is a cross-sectional view showing a semiconductor memory device according to the embodiment.

As shown in FIG. 27, the semiconductor memory device 6 according to the embodiment differs from the semiconductor memory device 5 according to the fifth embodiment described above (referring to FIG. 21) in that an oxide member 91 is provided between the tunneling insulating film 47 and the inter-electrode insulating film 41 on the two Z-direction sides of the floating gate electrode 32. The configuration of the oxide member 91 in the XZ cross section is a substantially triangular configuration or a substantially trapezoidal configuration that is finer toward the floating gate electrode 32. Due to the existence of the oxide member 91, in the Z-direction, the length of the floating gate electrode 32 is shorter than the length of the inter-electrode insulating film 41 and the length of the conductive film 42.

The method for manufacturing the semiconductor memory device according to the embodiment is similar to that of the fifth embodiment described above up to the formation process of the floating gate electrode 32 shown in FIG. 26. In the embodiment, oxidation treatment is performed after forming the floating gate electrode 32 as shown in FIG. 27. Thereby, the oxide member 91 that has a bird's beak configuration is formed between the tunneling insulating film 47 and the inter-electrode insulating film 41. Thereafter, the manufacturing method is similar to that of the fifth embodiment.

According to the embodiment, by providing the oxide member 91 between the tunneling insulating film 47 and the inter-electrode insulating film 41, the capacitance between the control gate electrode 31 and the silicon pillar 21 increases; and the coupling improves. As a result, the controllability of the silicon pillar 21 by the control gate electrode 31 improves; and the operations are stable.

Otherwise, the configuration, the manufacturing method, and the effects of the embodiment are similar to those of the first embodiment described above.

A seventh embodiment will now be described.

Figure 28:
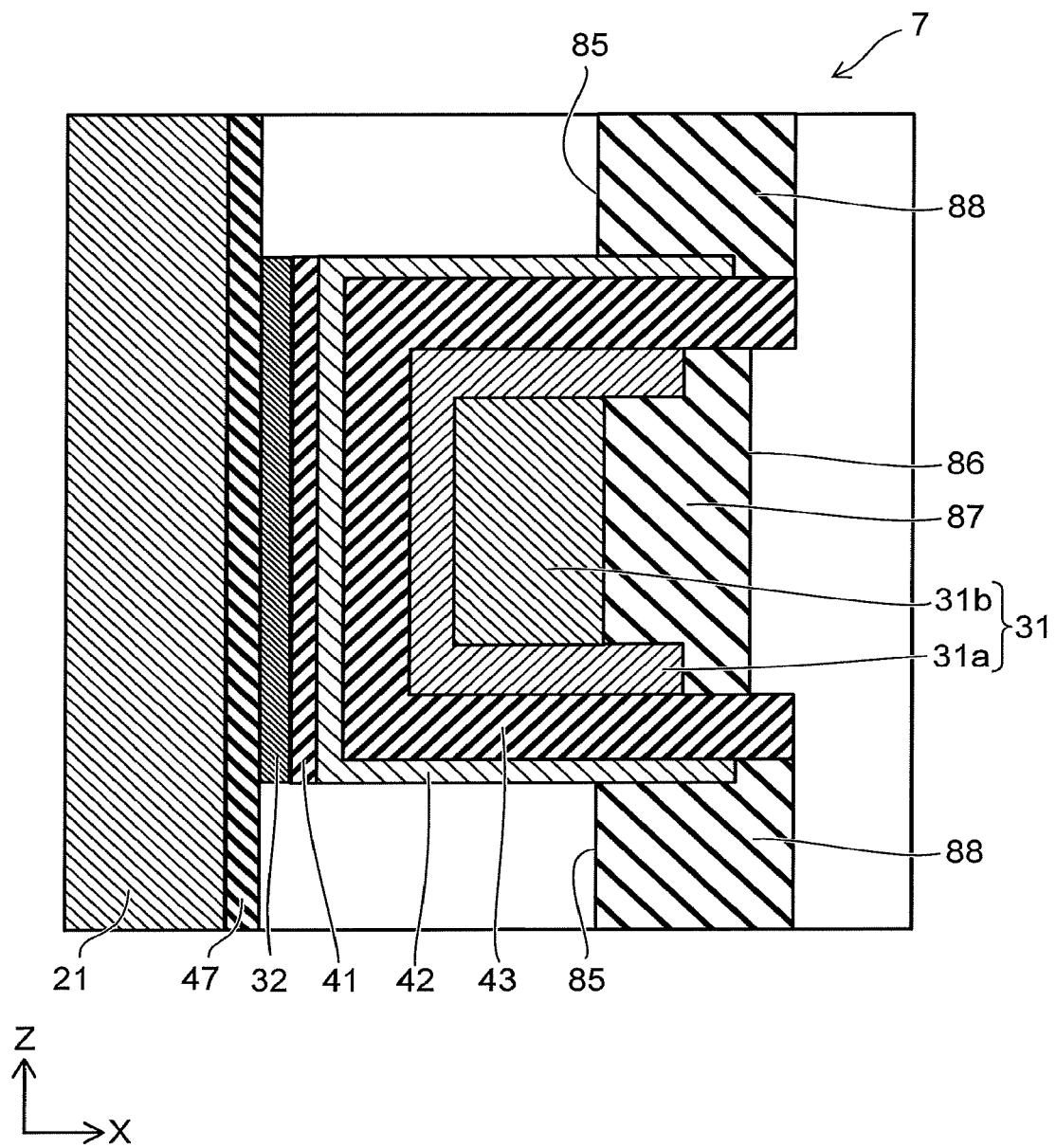
FIG. 28 is a cross-sectional view showing a semiconductor memory device according to a seventh embodiment.

FIG. 28 is a cross-sectional view showing a semiconductor memory device according to the embodiment.

In the semiconductor memory device 7 according to the embodiment as shown in FIG. 28, the inter-electrode insulating film 41 is provided only between the floating gate electrode 32 and the conductive film 42 and is not provided on the two Z-direction sides of the conductive film 42.

A method for manufacturing the semiconductor memory device according to the embodiment will now be described.

Figure 29:
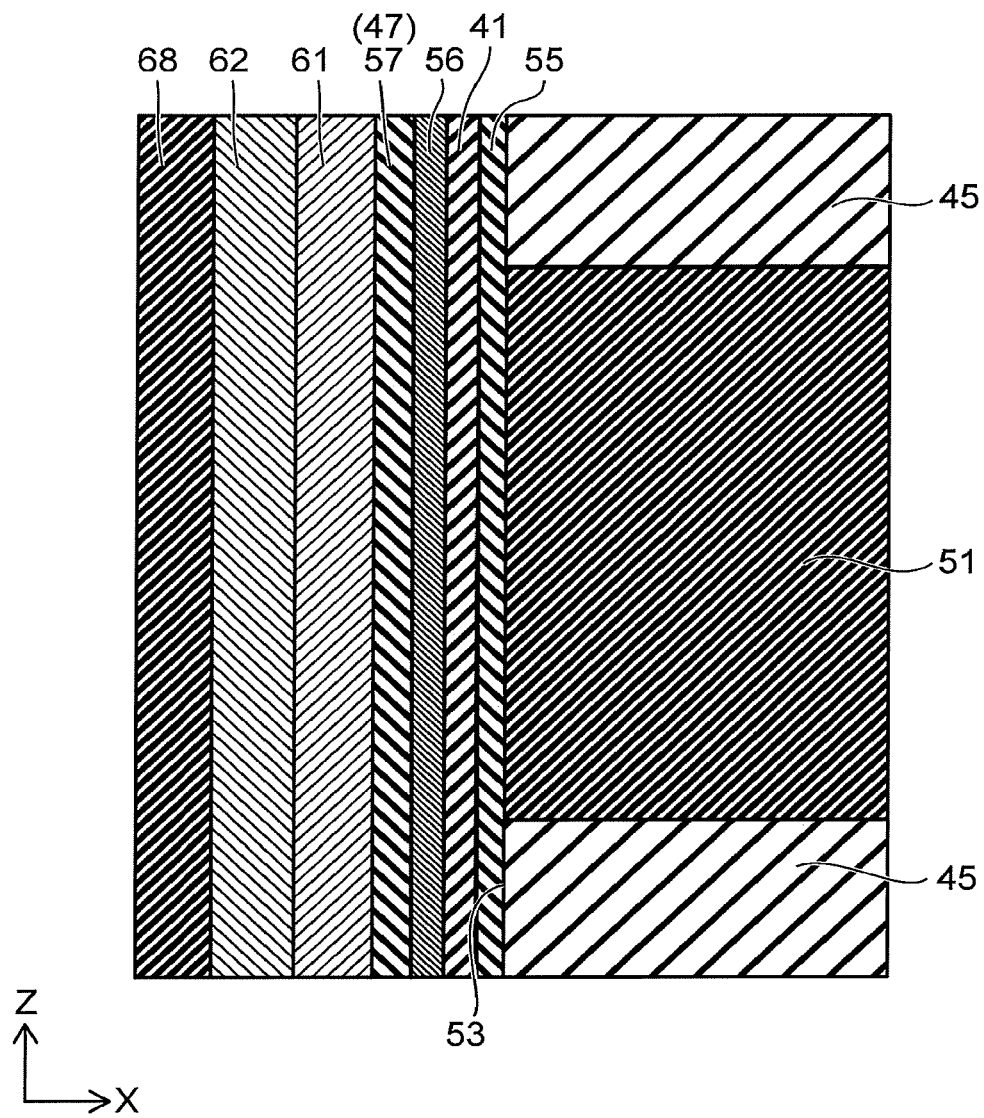
FIG. 29 and FIG. 30 are cross-sectional views showing a method for manufacturing the semiconductor memory device according to the seventh embodiment.
Figure 30:
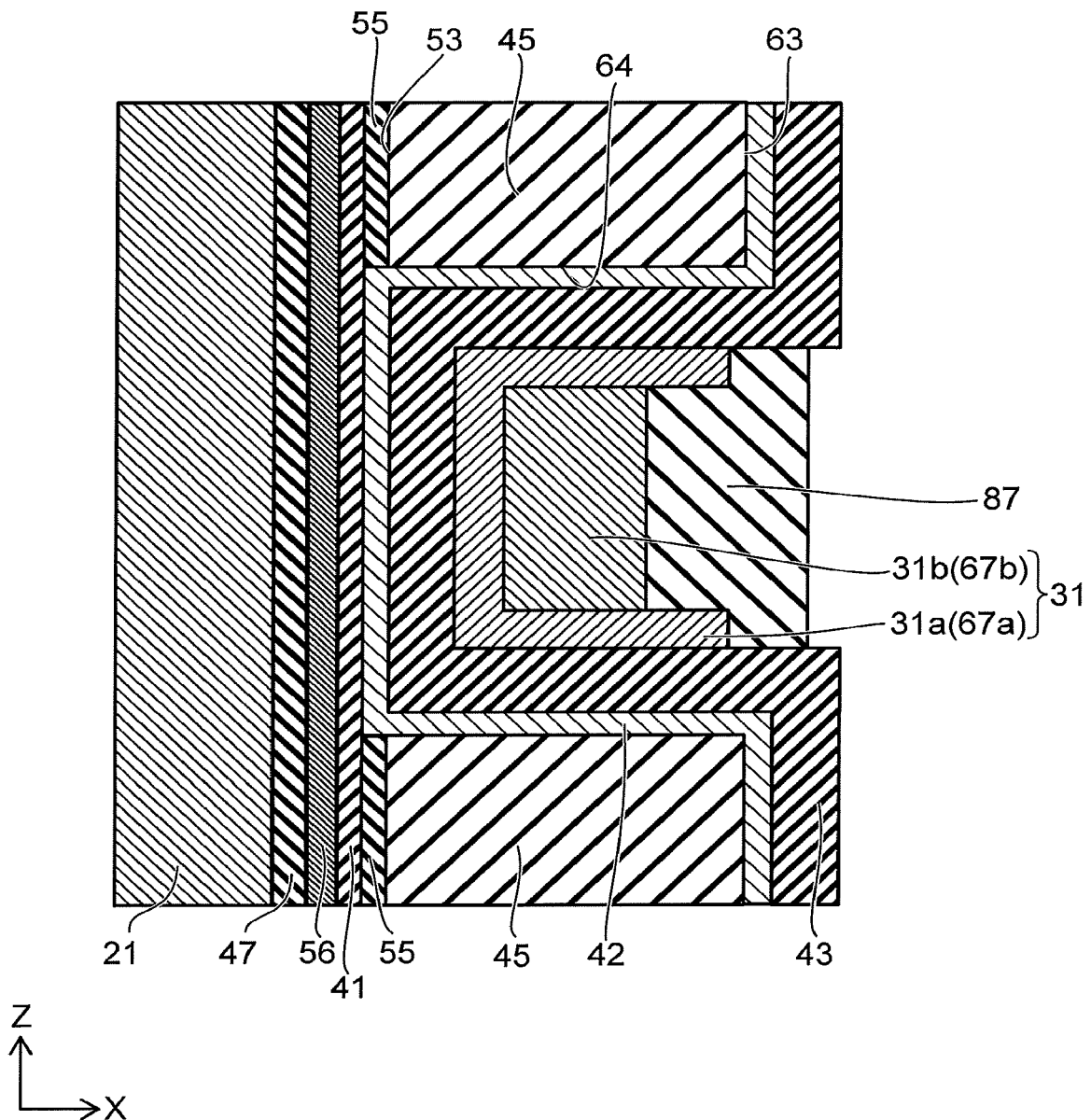

FIG. 29 and FIG. 30 are cross-sectional views showing the method for manufacturing the semiconductor memory device according to the embodiment.

The embodiment is similar to the sixth embodiment described above up to the process of forming the cover layer 55. Namely, as shown in FIG. 3 and FIG. 4, the cell source line 15 and the stacked body 52 are formed on the silicon substrate 10; and the memory trenches 53 are formed in the stacked body 52.

Then, as shown in FIG. 29, the cover layer 55 that is made of silicon oxide is formed on the side surface of the memory trench 53. Also, in the embodiment, the inter-electrode insulating film 41 is formed after forming the cover layer 55. Then, similarly to the sixth embodiment, the silicon film 56, the silicon oxide film 57, and the silicon film 61 are formed in this order. Then, the silicon film 62 is formed after exposing the cell source line 15 at the bottom surface of the memory trench 53 by performing etch-back. Then, the insulating member 68 is formed inside the memory trench 53.

Then, similarly to the sixth embodiment, the silicon pillars 21 are formed by dividing the silicon film 61 and the silicon film 62 along the Y-direction. At this time, the silicon oxide film 57, the silicon film 56, the inter-electrode insulating film 41, and the cover layer 55 are not divided. Then, the insulating member 48 is formed by filling an insulating member 69 into the space 71 formed by the etching.

Then, as shown in FIG. 30, the slit 63 that extends in the Y-direction is formed in the stacked body 52. Then, the recess 64 is formed in the side surface of the slit 63 by removing the sacrificial film 51 (referring to FIG. 29) via the slit 63. Then, the portion of the cover layer 55 exposed inside the recess 64 is removed via the slit 63 and the recess 64. Thereby, the inter-electrode insulating film 41 that is formed in the process shown in FIG. 29 is exposed at the back surface of the recess 64. Then, the conductive film 42 and the blocking insulating film 43 are formed in this order in the slit 63 and on the inner surface of the recess 64. Then, the titanium nitride layer 67a and the tungsten film 67b are formed; and the control gate electrode 31 is formed inside each of the recesses 64 by performing etch-back. Then, the capping film 87 is formed at a portion covering the control gate electrode 31 by depositing, for example, silicon nitride via the slit 63 and by performing etch-back.

Then, as shown in FIG. 28, etch-back of the blocking insulating film 43 and the conductive film 42 is performed via the slit 63. Thereby, the blocking insulating film 43 and the conductive film 42 are caused to remain only inside the recess 64.

Then, the inter-layer insulating films 45 and the cover layer 55 are removed via the slit 63. Thereby, the air gap 85 that communicates with the slit 63 is formed. The inter-electrode insulating film 41 is exposed at the back surface of the air gap 85. Then, isotropic etching such as wet etching or the like is performed via the slit 63 and the air gap 85. Thereby, the portions of the inter-electrode insulating film 41 and the silicon film 56 exposed inside the air gap 85 are removed. As a result, the silicon film 56 is divided along the Z-direction to become the multiple floating gate electrodes 32.

Thereafter, the manufacturing method is similar to that of the sixth embodiment described above. Thus, the semiconductor memory device 7 according to the embodiment is manufactured.

Effects of the embodiment will now be described.

In the embodiment as shown in FIG. 30, the inter-electrode insulating film 41 and the silicon film 56 are interposed between the cover layer 55 and the tunneling insulating film 47 when performing the wet etching to remove the cover layer 55. Therefore, the tunneling insulating film 47 is not damaged by the etching because the tunneling insulating film 47 is protected by the inter-electrode insulating film 41 and the silicon film 56. If the tunneling insulating film 47 were not protected by the silicon film 56, etc., the tunneling insulating film 47 would be undesirably damaged by the etching for removing the cover layer 55 because the cover layer 55 and the tunneling insulating film 47 both are formed of silicon oxide.

Also, according to the embodiment, because the tunneling insulating film 47 can be protected by the two layers of the cover layer 55 and the floating gate electrode 32, it is unnecessary to set the floating gate electrode 32 to be excessively thick to protect the tunneling insulating film 47. Thereby, the floating gate electrode 32 can be set to be even thinner; and the program operation and the erase operation can be faster.

Otherwise, the configuration, the manufacturing method, and the effects of the embodiment are similar to those of the fifth embodiment described above.

An eighth embodiment will now be described.

Figure 31:
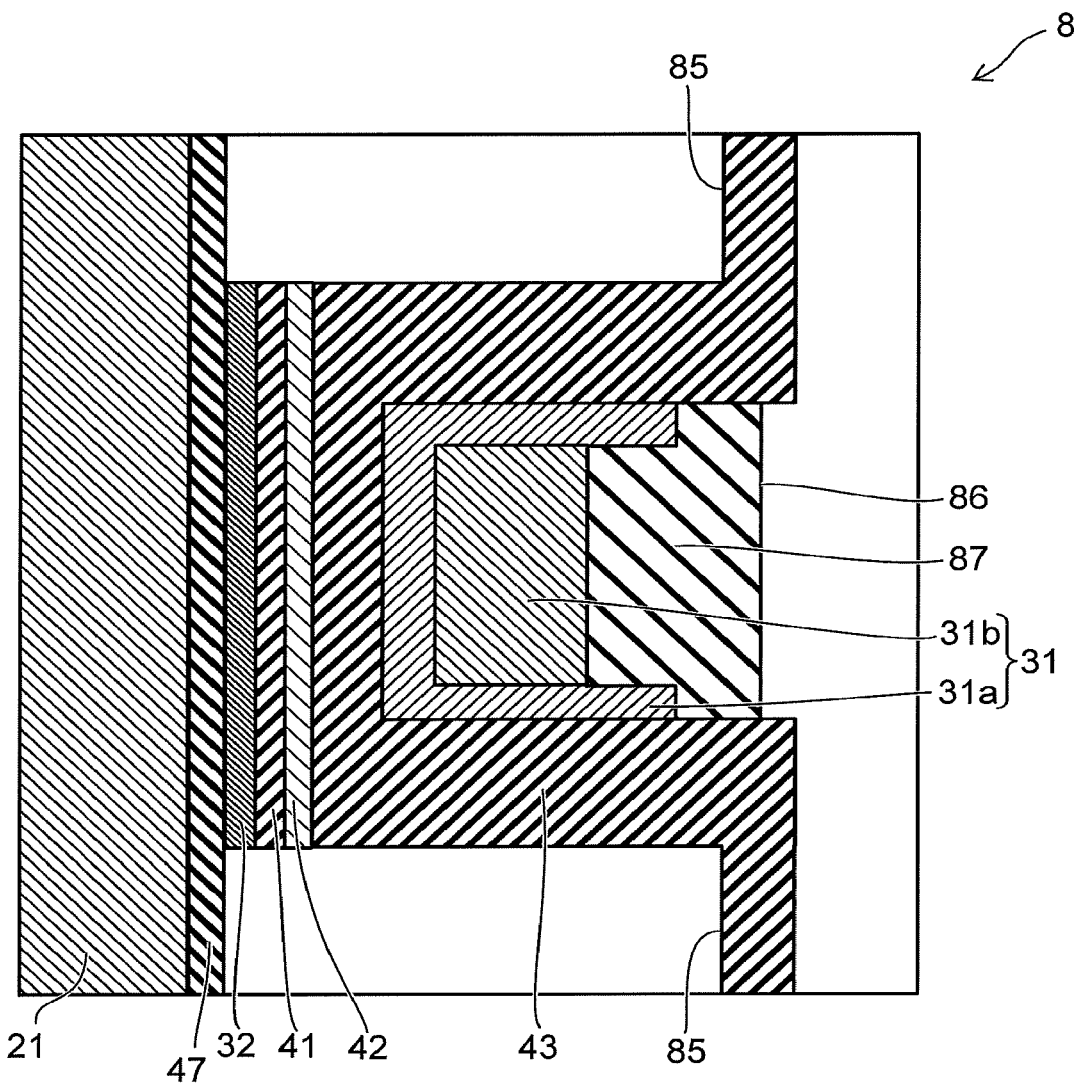
FIG. 31 is a cross-sectional view showing a semiconductor memory device according to an eighth embodiment.

FIG. 31 is a cross-sectional view showing a semiconductor memory device according to the embodiment.

As shown in FIG. 31, the semiconductor memory device 8 according to the embodiment differs from the semiconductor memory device 7 according to the seventh embodiment described above (referring to FIG. 28) in that the conductive film 42 is provided only between the floating gate electrode 32 and the blocking insulating film 43 and is not provided on the two Z-direction sides of the blocking insulating film 43; the capping film 88 is not provided; and the air gap 85 and the air gap 86 are partitioned by a portion of the blocking insulating film 43.

A method for manufacturing the semiconductor memory device according to the embodiment will now be described.

The embodiment differs from the first embodiment described above in that the conductive film 42 is formed from the memory trench 53 side.

FIG. 32 to FIG. 36 are cross-sectional views showing the method for manufacturing the semiconductor memory device according to the embodiment.

Figure 32:
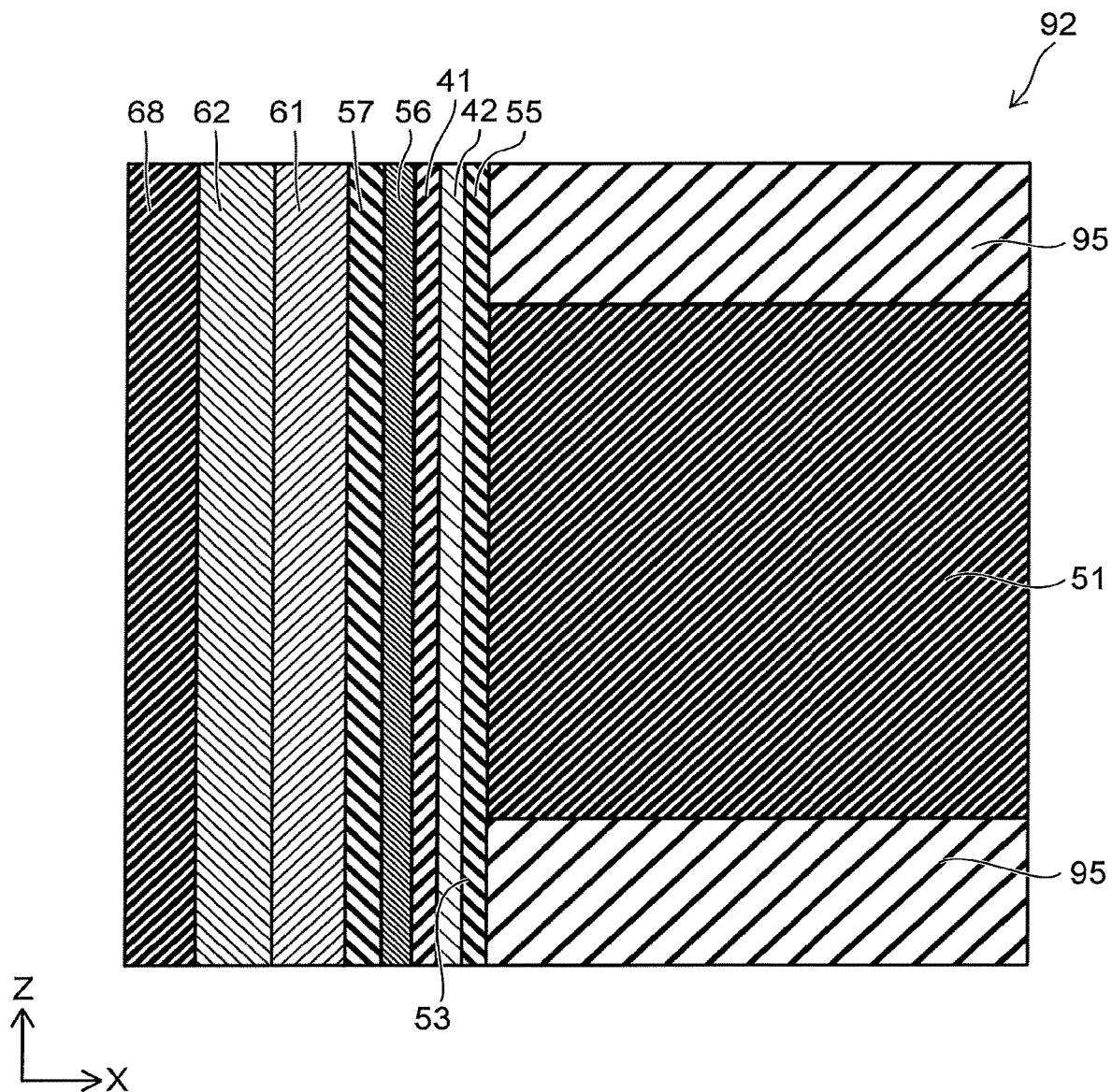
FIG. 32 to FIG. 36 are cross-sectional views showing a method for manufacturing the semiconductor memory device according to the eighth embodiment.
Figure 33:
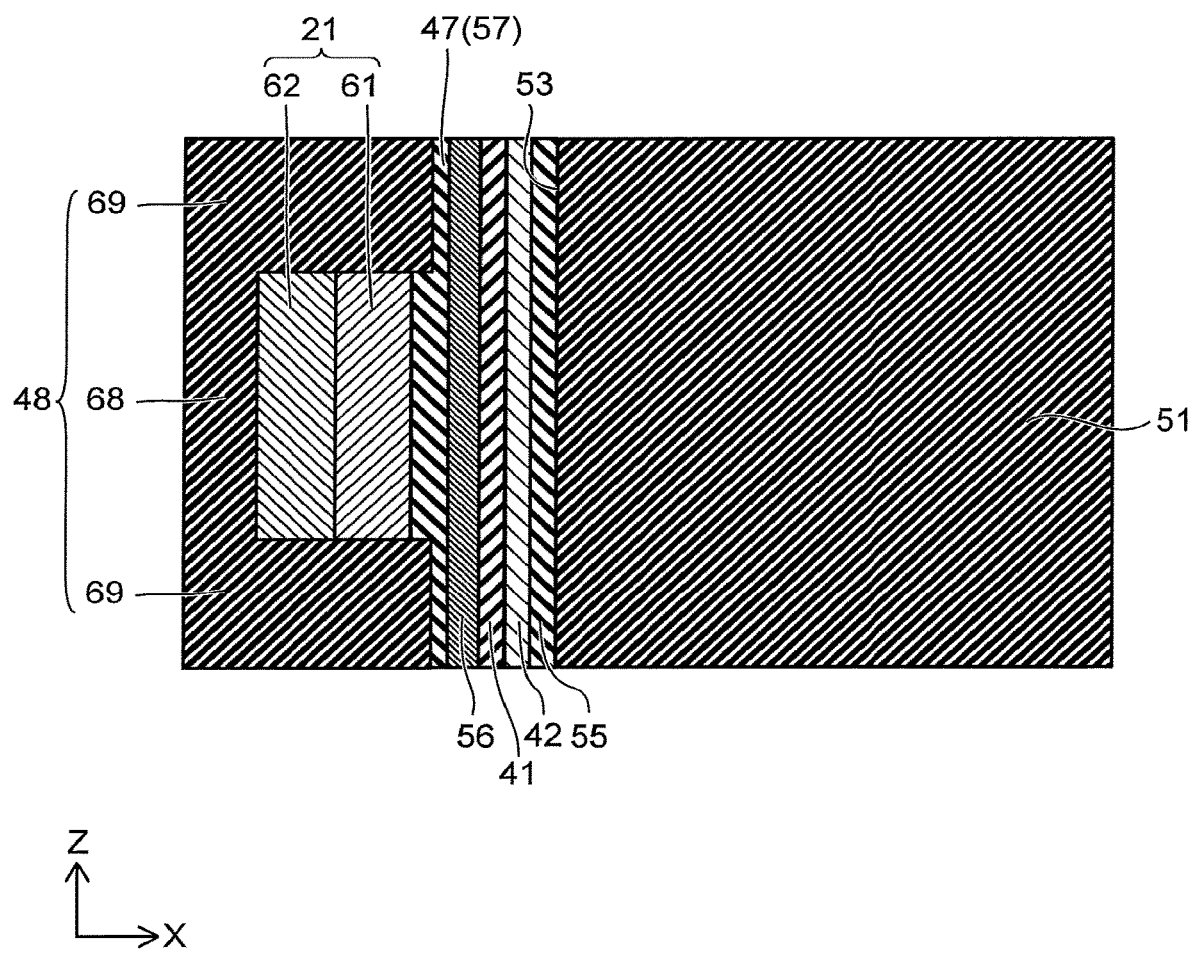

FIG. 32 and FIG. 34 to FIG. 36 show the XZ cross section; and FIG. 33 shows the XY cross section.

First, as shown in FIG. 1A, the insulating film 11 and the cell source line 15 are formed on the silicon substrate 10.

Then, as shown in FIG. 32, a stacked body 92 is formed on the cell source line 15 by alternately stacking a sacrificial film 95 made of silicon oxide and the sacrificial film 51 made of silicon nitride film. Then, the memory trench 53 that extends in the Y-direction is formed in the stacked body 92. Then, the cover layer 55 that is made of silicon oxide, the conductive film 42 that is made of ruthenium, the inter-electrode insulating film 41 that is made of silicon oxide or silicon nitride, the silicon film 56, the silicon oxide film 57, and the polysilicon film 61 are formed in this order on the inner surface of the memory trench 53. Then, the silicon film 62 is formed after performing anisotropic etching to expose the cell source line 15 at the bottom surface of the memory trench 53. Then, the insulating member 68 is filled into the memory trench 53.

Then, as shown in FIG. 33, the silicon film 61 and the silicon film 62 are divided along the Y-direction by performing RIE using a mask pattern in which lines-and-spaces are arranged along the Y-direction. Thereby, the silicon pillars 21 are formed. At this time, the silicon oxide film 57 is not divided and becomes the tunneling insulating film 47 as-is. Further, the silicon film 56, the inter-electrode insulating film 41, the conductive film 42, and the cover layer 55 also are not divided. Then, the insulating member 69 is filled into the memory trench 53. The insulating member 48 is formed of the insulating member 68 and the insulating member 69.

Figure 34:
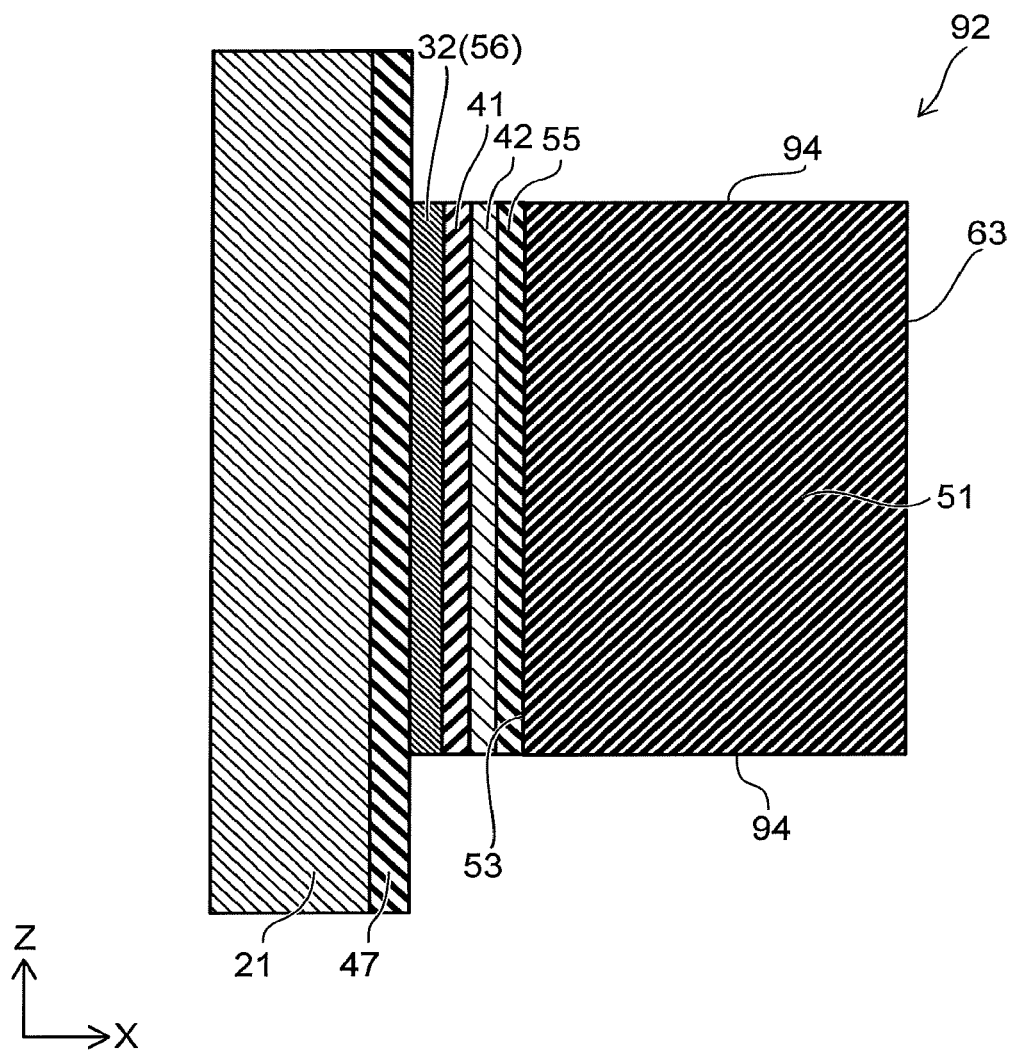

Then, as shown in FIG. 34, the slit 63 that extends in the Y-direction is formed in the stacked body 92. Then, the sacrificial film 95 that is made of silicon oxide (referring to FIG. 32) is removed via the slit 63 by performing isotropic etching, e.g., wet etching using DHF as the etchant. Thereby, a recess 94 is formed in the side surface of the slit 63. Then, the cover layer 55, the conductive film 42, the inter-electrode insulating film 41, and the silicon film 56 are selectively removed by performing etching via the recess 94. Thereby, the conductive film 42 is divided in the Z-direction; and the silicon film 56 is divided in the Z-direction to become the floating gate electrodes 32. At this time, the tunneling insulating film 47 is not divided.

Figure 35:
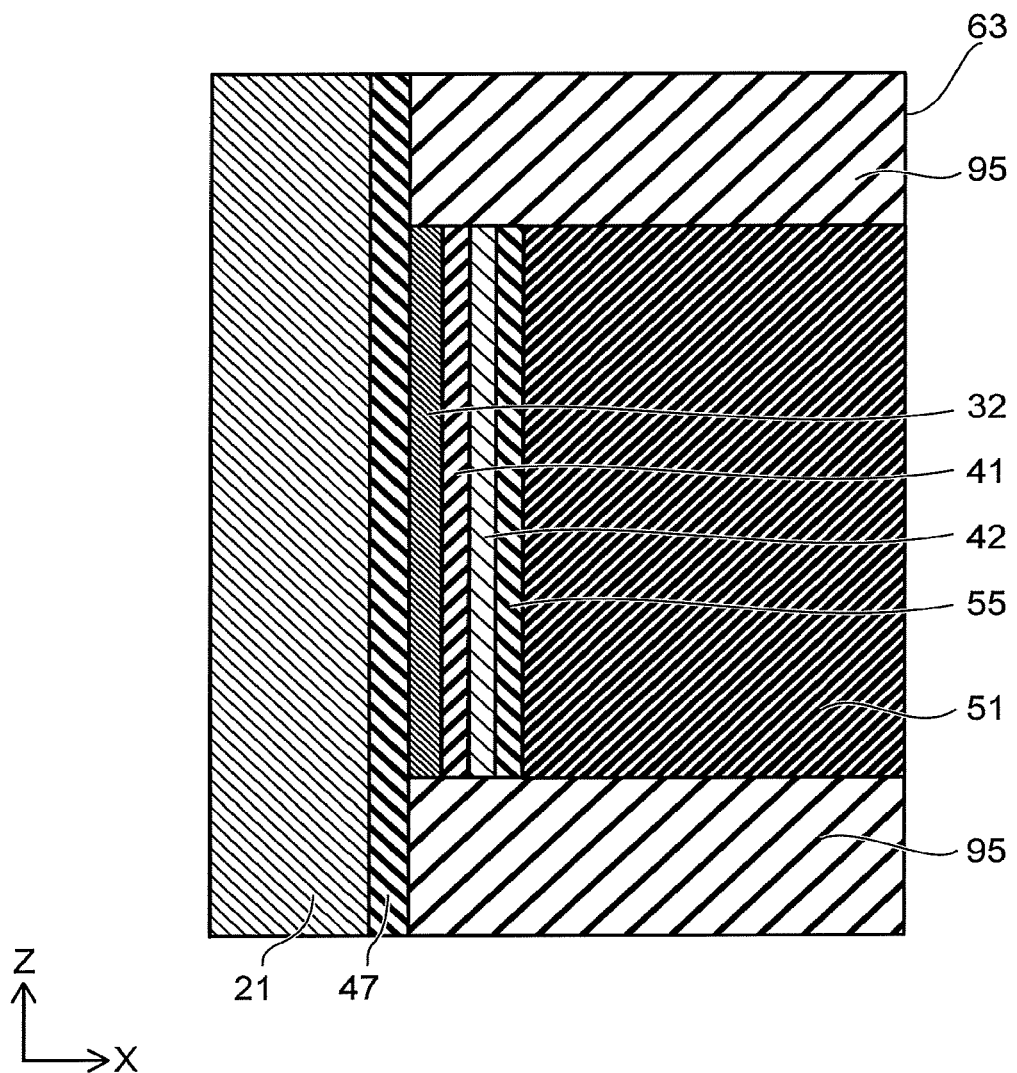

Then, as shown in FIG. 35, the sacrificial film 95 is filled into the recess 94 by depositing silicon oxide via the slit 63 and by performing etch-back.

Figure 36:
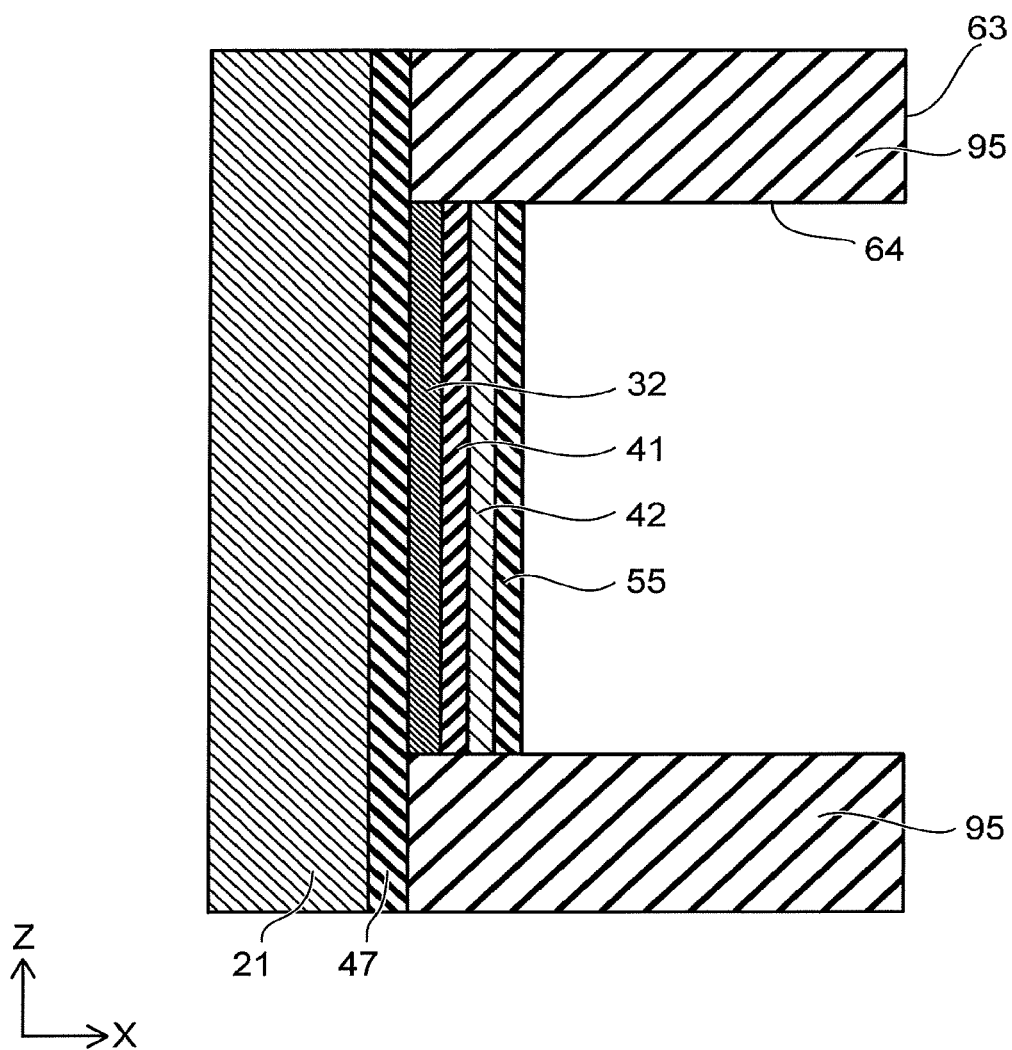

Then, as shown in FIG. 36, the sacrificial film 51 that is made of silicon nitride is removed via the slit 63 by performing isotropic etching, e.g., wet etching using hot phosphoric acid as the etchant. Thereby, the recess 64 is formed in the side surface of the slit 63. The cover layer 55 is exposed at the back surface of the recess 64. Then, the cover layer 55 is removed via the slit 63 and the recess 64.

Then, the blocking insulating film 43 is formed as shown in FIG. 31. The blocking insulating film 43 is formed also on the exposed surface of the sacrificial film 95 (referring to FIG. 36) at the inner surface of the slit 63. Then, the control gate electrode 31 is formed inside the recess 64 by depositing the titanium nitride layer 67a and the tungsten film 67b and by performing etch-back. Then, the sacrificial film 95 is removed. Thereby, the air gap 85 is formed after the sacrificial film 95 is removed. Also, the slit 63 becomes the air gap 86. A portion of the blocking insulating film 43 remains between the air gap 85 and the air gap 86. The subsequent processes are similar to those of the first embodiment described above. Thus, the semiconductor memory device 8 according to the embodiment is manufactured.

In the embodiment, it is unnecessary to pattern the blocking insulating film 43. As described above, the blocking insulating film 43 includes a high dielectric constant material, e.g., hafnium oxide, and is difficult to pattern using RIE, etc. Therefore, according to the embodiment, the semiconductor memory device can be manufactured easily.

Otherwise, the configuration, the manufacturing method, and the effects of the embodiment are similar to those of the fifth embodiment described above.

In the embodiment, the sacrificial film 95 may be used as the inter-layer insulating film as-is without removing the sacrificial film 95.

A ninth embodiment will now be described.

Figure 37:
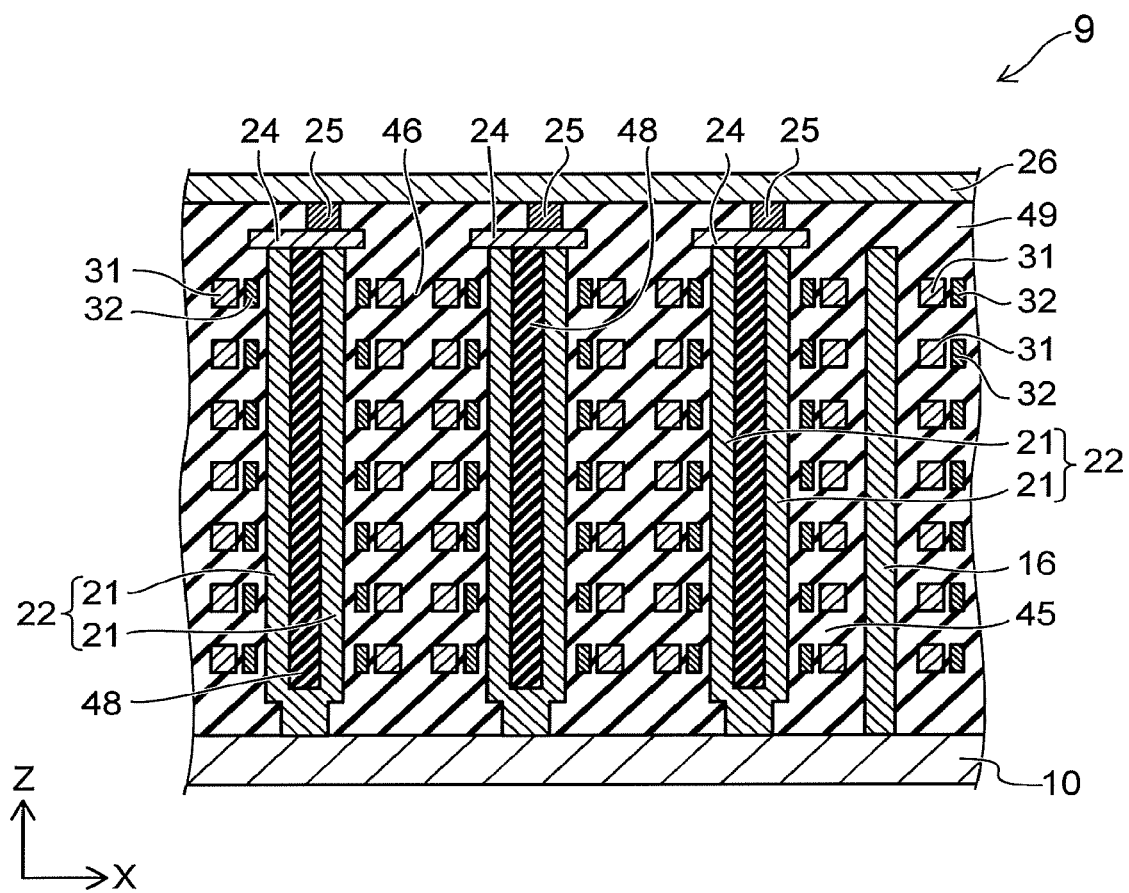
FIG. 37 is a cross-sectional view showing a semiconductor memory device according to a ninth embodiment.

FIG. 37 is a cross-sectional view showing a semiconductor memory device according to the embodiment.

As shown in FIG. 37, the semiconductor memory device 9 according to the embodiment differs from the semiconductor memory device 1 according to the first embodiment described above (referring to FIG. 1A) in that the insulating film 11 and the cell source line 15 are not provided; and the silicon pillars 21 are connected to the silicon substrate 10. An impurity is introduced to the upper layer portion of the silicon substrate 10; and the upper layer portion functions as a cell source line.

Otherwise, the configuration, the manufacturing method, and the effects of the embodiment are similar to those of the first embodiment described above.

A tenth embodiment will now be described.

Figure 38:
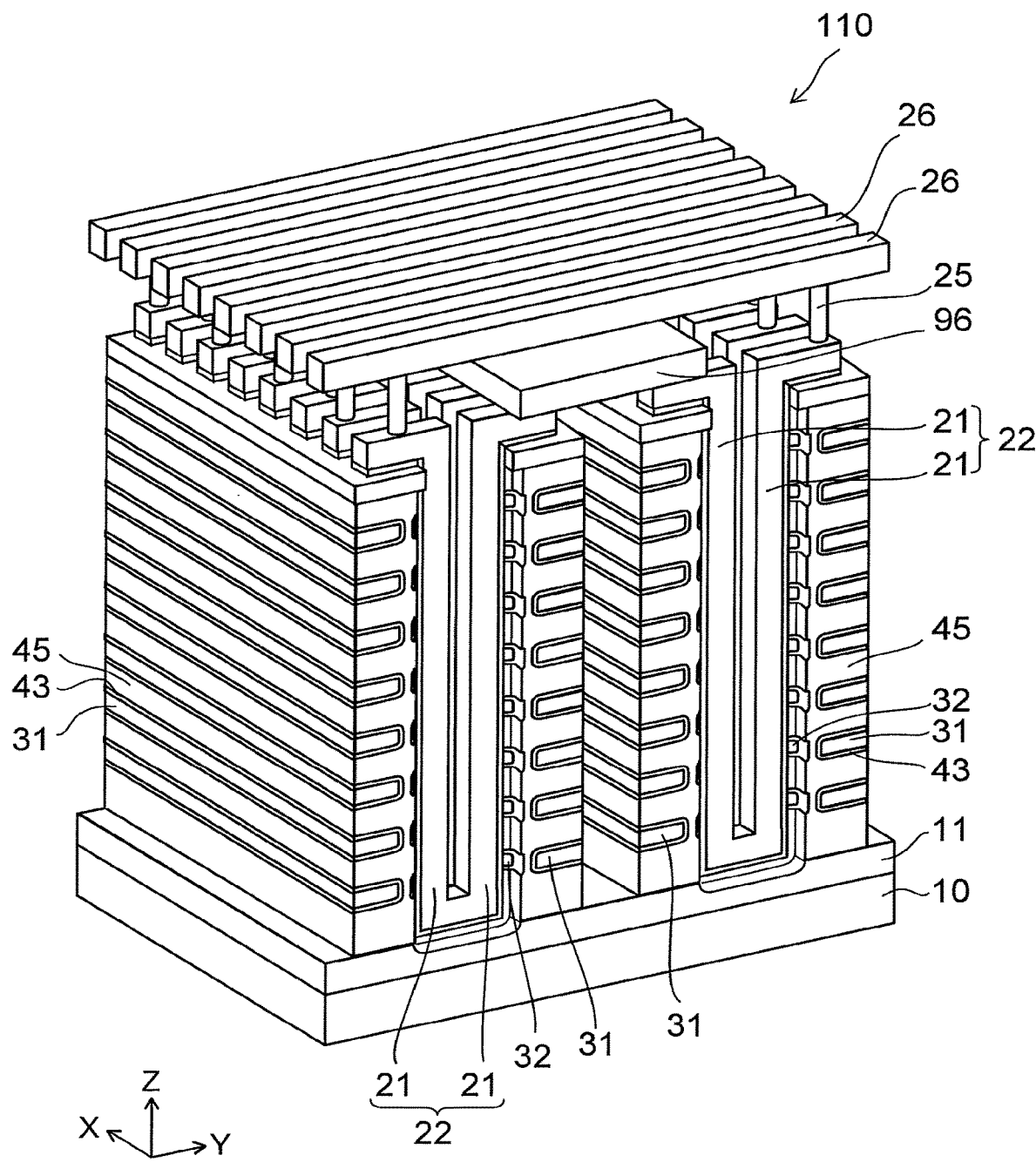
FIG. 38 is a perspective view showing a semiconductor memory device according to a tenth embodiment.

FIG. 38 is a perspective view showing a semiconductor memory device according to the embodiment.

As shown in FIG. 38, the semiconductor memory device 110 according to the embodiment differs from the semiconductor memory device 1 according to the first embodiment described above (referring to FIG. 1A) in that the cell source line 15 and the connection member 24 are not provided; and a source line 96 that extends in the Y-direction is provided between the silicon pillars 21 and the bit lines 26. Then, one of the two silicon pillars 21 included in the pillar pair is connected to the bit line 26; and the other one is connected to the source line 96. The two silicon pillars 21 that are adjacent to each other in the X-direction are connected to each of the source lines 96. The two silicon pillars 21 belong to mutually-different pillar pairs 22.

Otherwise, the configuration, the manufacturing method, and the effects of the embodiment are similar to those of the first embodiment described above.

An eleventh embodiment will now be described.

Figure 39A:
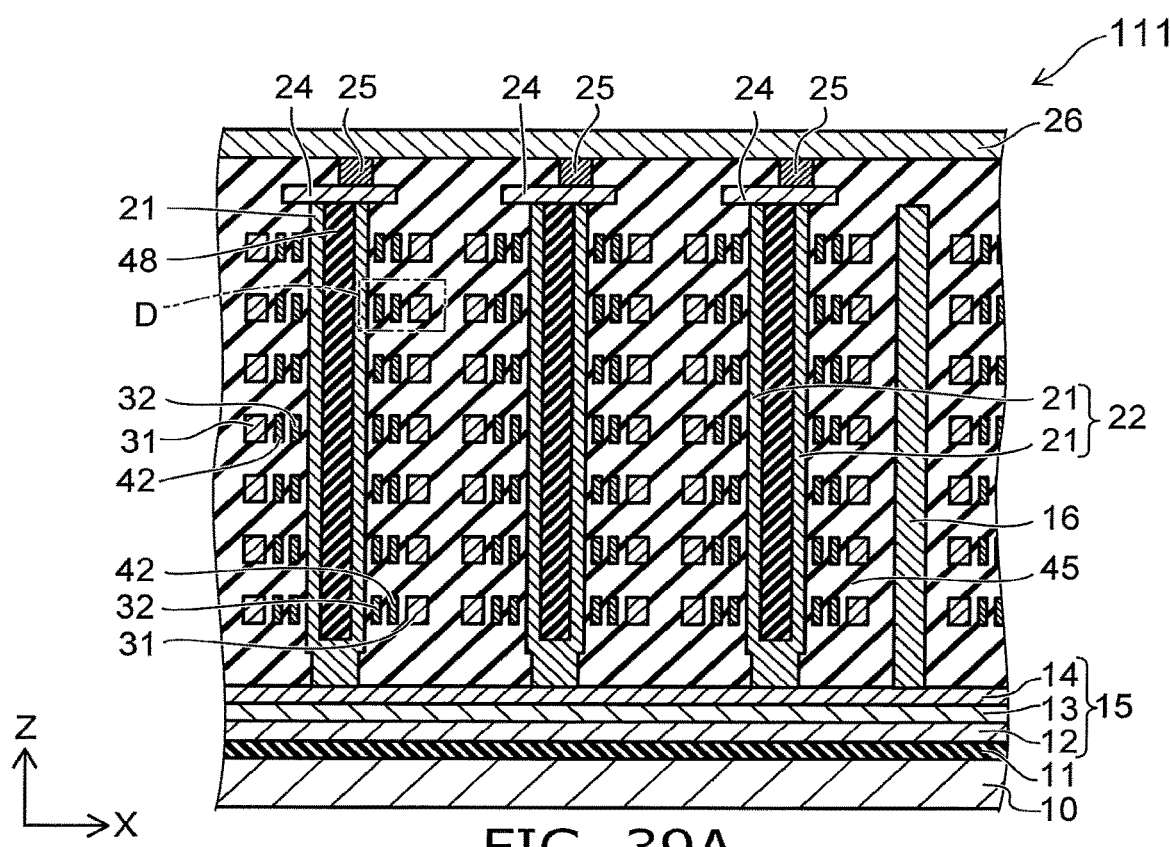
FIG. 39A is a cross-sectional view showing a semiconductor memory device according to an eleventh embodiment.
Figure 39B:
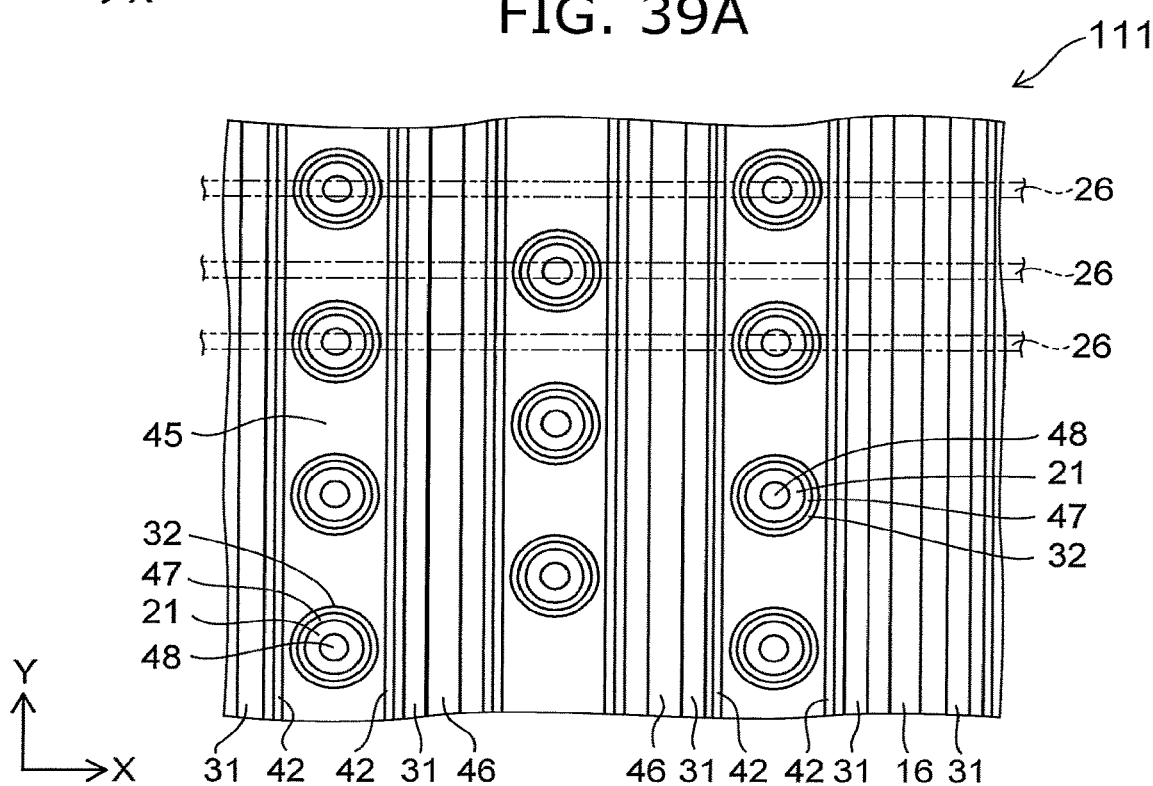
FIG. 39B is a plan view thereof.

FIG. 39A is a cross-sectional view showing a semiconductor memory device according to the embodiment; and FIG. 39B is a plan view of the semiconductor memory device according to the embodiment.

FIG. 39A and FIG. 39B are drawings corresponding to FIG. 1A and FIG. 1B of the first embodiment but are different from FIG. 1A and FIG. 1B in that the conductive film 42 also is illustrated.

As shown in FIG. 39A and FIG. 39B, in the semiconductor memory device 111 according to the embodiment, the insulating member 48 has a circular columnar configuration extending in the Z-direction; the silicon pillar 21 has a cylindrical configuration surrounding the insulating member 48; the tunneling insulating film 47 has a cylindrical configuration surrounding the silicon pillar 21; and the floating gate electrodes 32 are multiple annular members arranged along the Z-direction to surround the tunneling insulating film 47. On the other hand, the inter-electrode insulating film 41, the conductive film 42, the blocking insulating film 43, and the control gate electrode 31 have band configurations extending in the Y-direction. The enlarged view of region D of FIG. 39A is similar to FIG. 2.

Otherwise, the configuration, the manufacturing method, and the effects of the embodiment are similar to those of the first embodiment described above.

According to the embodiments described above, a semiconductor memory device and a method for manufacturing the semiconductor memory device can be realized in which the reliability is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor memory device, comprising:
    a substrate;
    a first semiconductor pillar provided above the substrate, the first semiconductor pillar extending in a first direction perpendicular to an upper surface of the substrate;
    a first electrode extending in a second direction crossing the first direction;
    a second electrode provided between the first semiconductor pillar and the first electrode, the second electrode being thicker than the first electrode in the first direction:
    a first insulating film provided between the first semiconductor pillar and the second electrode, the second electrode being thicker than the first insulating film in a third direction;
    a second insulating film provided between the first electrode and the second electrode and on two first-direction sides of the first electrode;
    a conductive film provided between the second electrode and the second insulating film, the conductive film not contacting the first insulating film, the conductive film being disposed also on the two first-direction sides of the first electrode, the conductive film being formed of titanium nitride; and a third insulating film provided between the second electrode and the conductive film, the conductive film being interposed between the third insulating film and the second insulating film that is thicker than the third insulating film.

2. The semiconductor memory device according to claim 1, wherein the conductive film is a continuous film.

3. The semiconductor memory device according to claim 1, wherein
the second electrode includes silicon.

4. The semiconductor memory device according to claim 1, further comprising:
another first electrode extending in the second direction and being provided to be separated from the first electrode in the third direction crossing both the first direction and the second direction; and
an air gap being formed between the first electrode and the other first electrode.

5. The semiconductor memory device according to claim 1, wherein the second electrode is thinner than the first insulating film in the first direction.

6. The semiconductor memory device according to claim 1, wherein a length of the second electrode in the first direction is shorter than a length of the second insulating film in the first direction.

7. The semiconductor memory device according to claim 1, wherein the third insulating film is disposed also on the two first-direction sides of the first electrode.

8. The semiconductor memory device according to claim 1, wherein a length of the second electrode in the first direction is shorter than a length of the third insulating film in the first direction.

9. The semiconductor memory device according to claim 1, further comprising a fourth insulating film contacting the second electrode and the third insulating film in the first direction.

10. The semiconductor memory device according to claim 9, wherein the fourth insulating film contacts the first insulating film.

11. The semiconductor memory device according to claim 1, further comprising:
a second semiconductor pillar provided above the substrate, the second semiconductor pillar extending in the first direction, the second semiconductor pillar being provided to be separated from the first semiconductor pillar in the third direction crossing the first and second directions;
a third electrode extending in the second direction and being provided to be separated from the first electrode in the third direction;
a fourth electrode provided between the second semiconductor pillar and the third electrode; and
a fifth insulating film provided between the second semiconductor pillar and the fourth electrode.

12. The semiconductor memory device according to claim 11, further comprising:
a first insulating member provided between the first semiconductor pillar and the second semiconductor pillar and extending in the first and the second direction.

13. The semiconductor memory device according to claim 12, wherein the first insulating member is an air gap.

14. The semiconductor memory device according to claim 11, further comprising:
a third semiconductor pillar provided above the substrate, the third semiconductor pillar extending in the first direction, the third semiconductor pillar being provided to be separated from the first semiconductor pillar in the third direction;
a fifth electrode extending in the second direction and being provided to be separated from the first electrode in the third direction,
a sixth electrode provided between the third semiconductor pillar and the fifth electrode; and
a second insulating member provided between the first electrode and the fifth electrode and extending in the first and second directions,
wherein the first semiconductor pillar is provided between the second semiconductor pillar and the third semiconductor pillar.

15. The semiconductor memory device according to claim 14, further comprising a seventh electrode extending in the third direction and being connected to the first semiconductor pillar, the second semiconductor pillar, and the third semiconductor pillar.

16. The semiconductor memory device according to claim 14, wherein only the second insulating member is provided between the first electrode and the fifth electrode.

* * * * *